(12) United States Patent
Nakano et al.

(10) Patent No.: US 7,579,275 B2
(45) Date of Patent: Aug. 25, 2009

(54) ELECTRIC PLATING METHOD, ELECTRIC PLATING APPARATUS, PROGRAM FOR PLATING, RECORDING MEDIUM, AND MANUFACTURING METHOD AND MANUFACTURING APPARATUS FOR SEMICONDUCTOR DEVICE

(75) Inventors: Hiroshi Nakano, Hitachi (JP); Takeyuki Itabashi, Hitachi (JP); Haruo Akahoshi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/253,480

(22) Filed: Sep. 25, 2002

(65) Prior Publication Data

US 2003/0079683 A1 May 1, 2003

(30) Foreign Application Priority Data

Oct. 25, 2001 (JP) .............................. 2001-327875

(51) Int. Cl.
*H01L 21/44* (2006.01)
*B01J 19/12* (2006.01)
*G01N 27/26* (2006.01)
*B05C 3/00* (2006.01)

(52) U.S. Cl. ...................... 438/678; 204/193; 204/406; 118/400

(58) Field of Classification Search ......... 204/193–194, 204/406, 409, 411–412, 196.15, 230.1, 229.1, 204/230.7, 275.1; 438/678; 118/400
See application file for complete search history.

(56) References Cited

U.S. PATENT DOCUMENTS

| 4,120,759 | A | * | 10/1978 | Asami et al. ................... 205/82 |
| 4,384,937 | A | * | 5/1983 | Shuster et al. ............... 204/237 |
| 5,441,629 | A | * | 8/1995 | Kosaki ........................ 205/148 |
| 6,090,260 | A | * | 7/2000 | Inoue et al. .................. 205/102 |
| 6,179,983 | B1 | * | 1/2001 | Reid et al. ..................... 205/96 |
| 6,274,972 | B1 | * | 8/2001 | Mitsutake et al. ........... 313/292 |
| 6,379,520 | B1 | * | 4/2002 | Kuriyama et al. ............. 205/81 |
| 6,793,793 | B2 | * | 9/2004 | Yoshida et al. ................ 205/88 |
| 2001/0015321 | A1 | | 8/2001 | Reid et al. |
| 2003/0006144 | A1 | * | 1/2003 | Tremblay et al. ........... 205/618 |
| 2003/0042134 | A1 | * | 3/2003 | Tremblay et al. ......... 204/228.1 |
| 2003/0114004 | A1 | * | 6/2003 | Sato et al. ................... 438/689 |

FOREIGN PATENT DOCUMENTS

| JP | 10-152799 | * | 6/1998 |
| JP | 10-152799 | * | 9/1998 |

* cited by examiner

*Primary Examiner*—Chuong A. Luu
(74) *Attorney, Agent, or Firm*—Dickstein Shapiro LLP

(57) ABSTRACT

In electric plating of supplying a current between an anode electrode and a cathode electrode as a plated body immersed in a plating solution thereby forming a plated film comprising a conductor on a surface of the cathode electrode, a preliminary electrolytic electrode that comes in contact with the plating solution before the cathode electrode comes in contact with the plating solution is disposed, and the cathode electrode is brought into contact with the plating solution while supplying a preliminary electrolytic current between the preliminary electrolytic electrode and the anode electrode, whereby a uniform plated film with no voids can be formed while suppressing dissolution of the underlying conductive film in the electric plating treatment.

7 Claims, 17 Drawing Sheets

PLATING SOLUTION

PLATING SOLUTION

PLATING SOLUTION

PLATING SOLUTION

ELECTRIC PLATING METHOD, ELECTRIC PLATING APPARATUS, PROGRAM FOR PLATING, RECORDING MEDIUM, AND MANUFACTURING METHOD AND MANUFACTURING APPARATUS FOR SEMICONDUCTOR DEVICE

BACKGROUND OF THE INVENTION

The present invention relates to a plating method and a plating apparatus, a program for electric plating using the method and a recording medium for storing the program, as well as a manufacturing method and a manufacturing apparatus for semiconductor devices.

In recent years, an improvement in device operation speed has been demanded for attaining a higher degree of integration and higher function of semiconductor devices. However, an increase in the operation speed is more limited due to delay time of wiring as the device operation speed increases. In view of the above, it has been intended to improve the operation speed by decreasing the dielectric constant of interlayer insulation films to suppress inter-wiring capacitance and using wiring materials of low resistance to decrease wiring resistance.

For this purpose, it has been studied to form wirings by a damascene method using copper with a specific resistivity of as low as 1.7 μΩcm. Unlike formation of aluminum wirings, etc. by the existent sputtering method, the damascene method bores grooves or holes for wiring at first and then buries copper by electric plating into the grooves or holes to form wirings. For application of electric plating, conductive films are necessary so that a portion where the electric plating is applied can be made conductive. The conductive film is usually formed by depositing a copper film by a sputtering method. However, since copper itself is liable to be oxidized and not forms a passivation film, oxidation proceeds easily when it is exposed to atmospheric air.

On the other hand, electric plating to a wafer having a conductive film is usually applied by a batchwise treatment of discharging and supplying a plating solution for each plating treatment. In a cup type plating apparatus, a wafer as a cathode electrode is located at the upper end of a plating vessel and an anode electrode is located at a lower portion of the plating vessel being opposed to the cathode electrode. Accordingly, the wafer having the conductive film is in contact with a plating solution at the same time as the plating solution is filled in the plating vessel. Then, it is necessary to avoid uneven plating, for example, by keeping a wafer in a plating solution without applying electric plating for a certain period of time till the wafer is wetted sufficiently with the plating solution and bubbles on the surface are eliminated.

However, a copper plating solution is generally a copper sulfate solution containing sulfuric acid, which is a strongly acidic solution at a pH of 1 to 4. When a wafer having a surface oxidized conductive film is immersed in such an aqueous acidic solution without applying a voltage, copper oxide on the surface is dissolved easily.

Further, when nickel, cobalt, nickel alloy or cobalt alloy having a higher ionization tendency than that of copper is used for the conductive film and an underlying conductive film 47 formed by way of a barrier film 48 on the surface of an insulation film 46 is dissolved easily, as shown in FIG. 20A. In a case where the step coverage of the conductive film 47 is small, the conductive film is leached out locally at a portion where the film thickness is thin and, when electric plating is applied, the obtained copper plated film 49 possibly becomes uneven or incomplete to sometimes leave a void 50 in the film 49 as shown in FIG. 20B.

The thickness of the conductive film tends to be reduced on the wall surface of fine grooves or holes bored on the surface of the semiconductor wafer as compared with wafer surface. In a semiconductor device having a conductive film as extremely thin as 1 nm to 50 nm, since it is expected that the device will be further refined, it is conceivable that the thickness for the underlying conductive film will be further reduced. In such a super thin film, leaching of a conductive film or an oxide thereof, even little, results in ununiform thicknesses or local defects of the conductive film. Consequently, this causes unevenness of the thickness of the plated film, disconnection, voids or the like.

Then, to suppress the dissolution of the conductive film, Japanese Patent Laid-open No. 10-152799, for example, proposes an electric plating apparatus in which a positive electrode and a negative electrode are faced to each other in a plating vessel, an auxiliary negative electrode is located near the negative electrode and a plating power source is provided, wherein electric current is supplied from the auxiliary negative electrode to the negative electrode for a period of time in which a plating solution is not filled between the negative electrode and the positive electrode thereby substantially eliminating the dissolution of the underlying film of the negative electrode due to the plating solution. In this method, since the current is applied between the auxiliary negative electrode as a counter electrode and the negative electrode, dissolution of the conductive film is suppressed after both of the plated body as the negative electrode and the auxiliary negative electrode come in contact with the plating solution to be brought into electrical conduction.

In this case, when the current is applied, the auxiliary negative electrode acts as an anode electrode while the negative electrode acts as a cathode electrode. As a result, the plated body comes in contact with the plating solution for a certain period of time until both of the negative electrode and the auxiliary negative electrode are wetted with the plating solution, with no suppression for the dissolution of the conductive film, so that an oxide film formed on the surface of the conductive film is partially dissolved. Therefore, this increases unevenness of the underlying film.

To suppress the dissolution of the conductive film at the instant the plated body comes in contact with the plating solution, current has to be supplied at the instance the plated body comes in contact with the plating solution. However, the dip timing of the wafer surface to the plating solution is not uniform. In a usual cup type plating apparatus, since the plating solution is introduced from an inlet at the lower center of a plating vessel as a jet stream into the plating vessel, the surface of the plating solution is raised more in the central portion of the plating vessel as compared with the vicinity of the wall surface of the plating vessel, so that the wafer is wetted from the central portion with the plating solution. For example, in a case where a current is supplied at the instance a portion of the plated body comes in contact with the plating solution, since the current is concentrated only to a portion in contact with the plating solution, electric plating is started locally to increase variations in the film thickness.

Further, while a voltage may be previously applied prior to the contact of the plated body with the plating solution so that a minute current flows when the plated body comes in contact with the plating solution. However, when a portion of the plated body comes in contact with the plating solution to enable electric conduction with the auxiliary electrode, since the current is concentrated also in this case to a local region wetted with the plating solution, a current enough to proceed plating flows, making it difficult to obtain a uniform plated film.

SUMMARY OF THE INVENTION

In view of the foregoing, an object of this invention is to provide a plating method capable of suppressing the dissolution of an underlying conductive film in an electric plating treatment, thereby forming a uniform plated film with no voids, a program for electric plating using the method, a memory medium for storing the program, as well as a manufacturing method and a manufacturing apparatus for semiconductor devices (also including semiconductor elements).

To attain the foregoing purpose, this invention provides an electric plating method of supplying an electric current between an anode electrode and a cathode electrode as a plated body immersed in a plating solution, thereby forming a plated film comprising a conductor on the surface of the cathode electrode, in which the method comprises providing a preliminary electrolytic electrode that comes in contact with a plating solution before the cathode electrode comes in contact with the plating solution, bringing the cathode electrode into contact with the plating solution while supplying preliminary electrolytic current between the preliminary electrolytic electrode and an anode electrode thereby conducting plating after contact of the cathode electrode with the plating solution.

Further, this invention provides an electric plating method of supplying a current between an anode electrode and a cathode electrode as a plated body immersed in a plating solution thereby forming a plated film comprising a conductor on the surface of the cathode electrode, in which the method comprises supplying a preliminary electrolytic current between a preliminary electrolytic electrode and an anode electrode for a period of time after the anode electrode and the preliminary electrolytic electrode come in contact with a plating solution and before electric plating is started by the supply of a current between the anode electrode and the cathode electrode and distributing the current between the cathode electrode and the preliminary electrolytic electrode for a period of time after the contact of the cathode electrode with the plating solution and before the start of the electric plating. Also in this method, it is preferred that the preliminary electrolytic electrode and the cathode electrode are immersed in this order into the plating solution.

In the electric plating method according to this invention, it is preferred that the preliminary electrolytic current is from 0.001 to 0.1 A/dm$^2$. Further, while the electric plating method according to this invention is particularly suitable to copper plating, it is applicable also to plating for metals such as Fe, Ni, Pt, W or Ti, or alloys containing them as the main material.

Further, this invention provides a method of manufacturing a semiconductor device having a step of forming a conductive film for wirings by using the electric plating method according to this invention. This invention is suitable particularly to a case of forming wirings by a damascene process. Steps other than the step of forming the conductive film for wirings has no particular restriction and can be determined properly. For example, a step of forming an insulation film on a wafer surface, a step of forming a concave portion for forming wirings in the insulation film, a step of forming a conductive film by the plating method according to this invention so as to fill the concave portion and a step of coating the surface of the conductive film with an insulation film or surface protection film can be provided in the method of manufacturing the semiconductor device according to this invention.

Further, this invention provides an electric plating apparatus comprising a plating vessel, and an anode electrode and a preliminary electrolytic electrode located in the plating vessel in which the preliminary electrolytic electrode is wired in such a manner as to be in parallel as a current path with the cathode electrode as a plated body and is situated at a position where the preliminary electrolytic electrode comes in contact with a plating solution before the cathode electrode comes in contact with the plating solution upon introduction of the plating solution to the plating vessel. In the plating apparatus of this invention, it is preferred to provide a switch for electrically connecting or disconnecting the preliminary electrolytic electrode with the anode electrode.

Further, this invention provides an electric plating apparatus comprising a plating vessel, an anode electrode and a preliminary electrolytic electrode located in the plating vessel, and a power source in which the preliminary electrolytic electrode is electrically connected with the power source in such a manner as to be in parallel as a current path with the cathode electrode as a plated body and is situated at a position where the preliminary electrolytic electrode comes in contact with a plating solution before the cathode electrode comes in contact with the plating solution upon introduction of the plating solution to the plating vessel, and a switch is disposed between the preliminary electrolytic electrode and the power source.

In the plating apparatus of this invention described above, it is preferred that an area of a surface of the preliminary electrolytic electrode that comes in contact with the plating solution is one-half or more of an area of a surface of the cathode electrode that comes in contact with the plating solution. Further, the plating apparatus according to this invention may further comprise an auxiliary cathode electrode wired in such a manner as to be in parallel as a current path with the cathode electrode and application of plating to the cathode electrode may be conducted by applying a voltage between the cathode electrode and the auxiliary cathode electrode, and the anode electrode in the plating solution.

Further, this invention provides an apparatus for manufacturing a semiconductor device having means for forming a conductive film for wirings by using the electric plating apparatus of this invention.

Further, this invention provides a program for electric plating that allows a computer used for a electric plating method of supplying an electric current between an anode electrode and a cathode electrode as a plated body immersed in a plating solution thereby forming a plated film comprising a conductor on a surface of the cathode electrode to function as: preliminary electrolytic voltage application means for supplying a preliminary electrolytic current between the preliminary electrolytic electrode and the anode electrode upon detection that a liquid level of the plating solution has reached a predetermined height; and voltage application means for applying a voltage for plating between the cathode electrode and the anode electrode, and thereby conducting electric plating. In addition, this invention provides a computer readable memory medium that can store the program.

BRIEF DESCRIPTION OF THE DRAWINGS

Other objects and advantages of the invention will become apparent from the following description of embodiments with reference to the accompanying drawings in which.

DETAILED DESCRIPTION OF THE PREFERRED EMBODIMENTS

As has been described above, to solve the disadvantages caused by the solution of the conductive film in applying electric plating to fine grooves or holes provided on the surface of a semiconductor wafer, in accordance with this invention, there are provided an anode electrode, a plated body as a cathode electrode, and a preliminary electrolytic electrode in a plating vessel, in which the plated body and the preliminary electrolytic electrode are arranged in parallel as a current path, and plating is conducted by immersing the plated body in an electric plating solution while applying a minute current between the preliminary electrolytic electrode and the anode electrode.

At first, apparatus for manufacturing a semiconductor device and a chemical solution treatment apparatus (particularly, plating apparatus) used in each of embodiments are to be explained specifically.

A: Constitution of Plating Apparatus

An example of a plating apparatus disposed in a semiconductor device manufacturing apparatus according to this invention is to be described taking an automatic wafer plating apparatus, as an example, used in each of embodiments to be described later.

Figure 1:
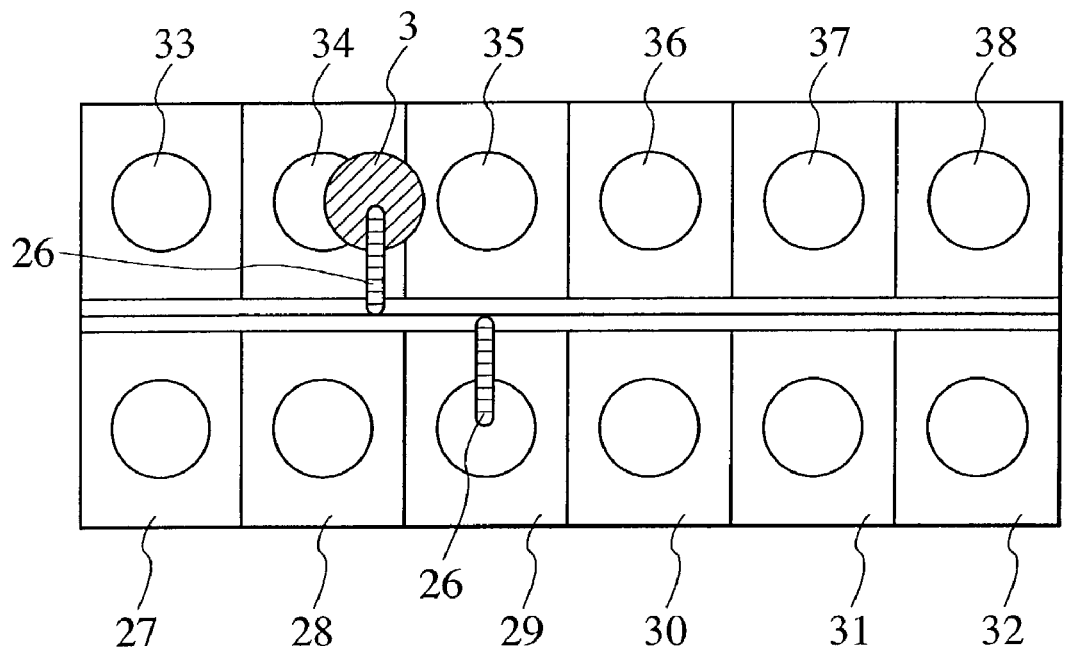
FIG. 1 is a schematic view showing an apparatus for manufacturing a semiconductor device according to a preferred embodiment of this invention.
Figure 2:
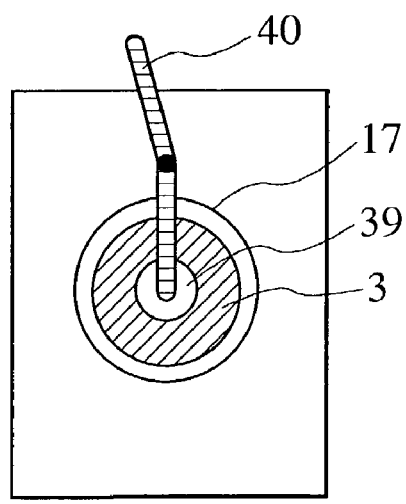
FIG. 2 is a schematic view showing an apparatus for manufacturing a semiconductor device according to a preferred embodiment of this invention.

A main body of an automatic wafer plating apparatus used in each of the embodiments comprises, as shown in FIG. 1, a transportation mechanism (transportation manipulator) 26, a load stage 27, a pre-plating stage 28, a plating stage 29, a cleaning stage 30, a drying stage 31 and an unload stage 32. Further, in addition to the main body, a chemical solution supply system and a chemical solution recovery system are provide (not illustrated).

There are disposed a wafer cassette 33 in the load stage 27, a plating pretreatment vessel 34 in the pre-plating state 28, a plating vessel 35 in the plating stage 29, a cleaning vessel 36 in the cleaning stage 30, a drier 37 in the drying stage 31 and a wafer cassette 38 in the unload stage 32. Among them, the plating pre-treatment vessel 34, the plating vessel 35 and the cleaning vessel 36 are chemical solution treatment vessels. Each of the chemical solution treatment vessels is provided, for example, with pipelines for chemical solution, temperature controller (not illustrated), etc.

Each of the stages 27 to 32 may be provided in plurality to increase the number of sheets to be processed. Further, while the pre-plating stage 26 and the cleaning stage 30 may be omitted, they are preferably disposed so as to flatten the plated film. The transportation manipulator 26 has a wafer carry arm 40 and a wafer carry portion 39, which is a mechanism for holding the wafer 3 and transporting the same to a predetermined position (for example, to chemical solution treatment vessel 17).

Figure 3:
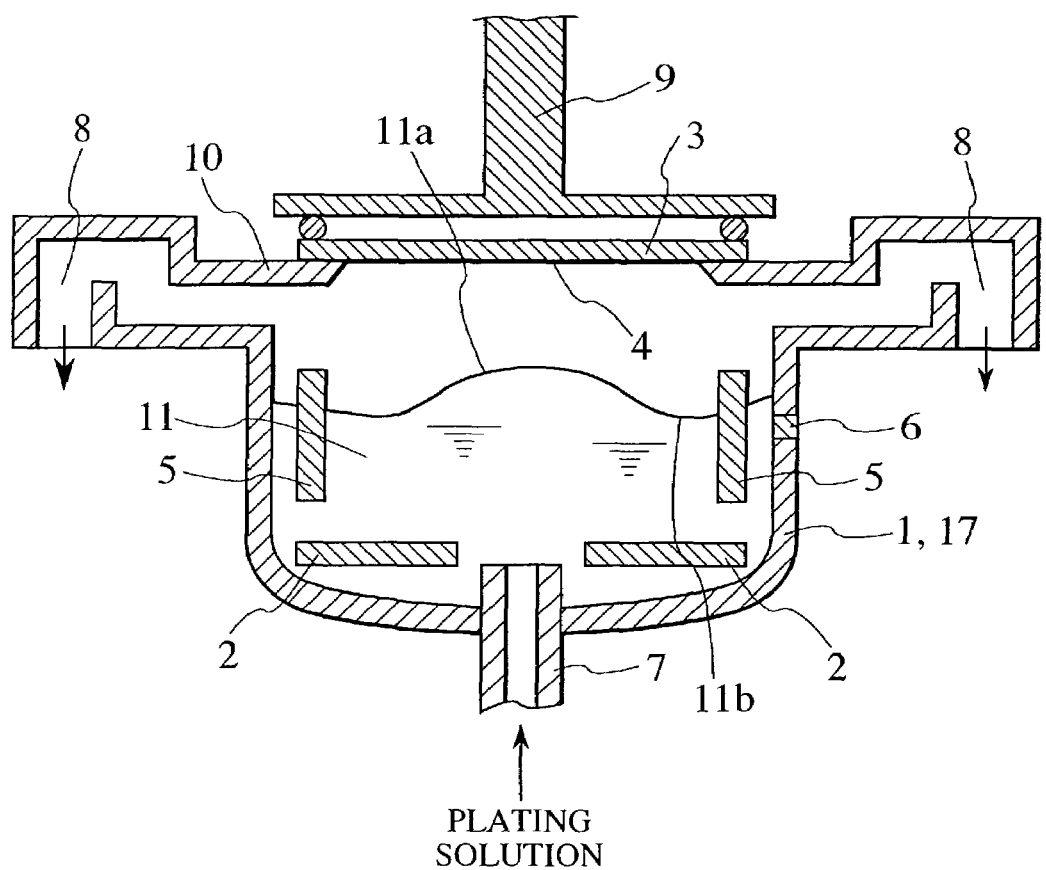
FIG. 3 is a cross section of a cup-type plating apparatus in Example 1 of this invention.

In the chemical solution treatment vessel 17 of the automatic wafer plating apparatus in this embodiment, a cup-type treatment vessel 1, for example, as shown in FIG. 3 can be used. In the cup-type treatment vessel 1, a wafer support portion 10 is disposed along an upper opening of the cup-type treatment vessel 1, and a chemical solution supply section 7 is disposed below the support portion 10 in such a manner as to penetrate from the outside to the inside of treatment vessel 1, so that a chemical solution 11 supplied as a jet stream from the chemical solution supply section 7 is discharged to the outside of the treatment vessel 1 from a liquid solution discharge port 8. A level meter 6 is disposed on the side wall of the treatment vessel 1 and the level of the chemical solution 11 supplied can be measured. A chemical solution treatment is applied when the treated surface 4 of the wafer 3 placed on the support portion 10 and fixed by a wafer retaining jig 9 comes in contact with the chemical solution.

When the chemical solution treatment is a plating treatment, an anode electrode 2 and a preliminary electrolytic electrode 5 for suppressing the dissolution of the cathode conductive film are disposed inside the treatment vessel 1. While the preliminary electrolytic electrode 5 is previously located in the treatment vessel 1 in this example, this invention is not restricted only thereto but a support member for detachably supporting the preliminary electrolytic electrode 5 may be disposed in the treatment chamber 1 and the preliminary electrolytic electrode 5 may be attached to the support member upon use.

Figure 4:
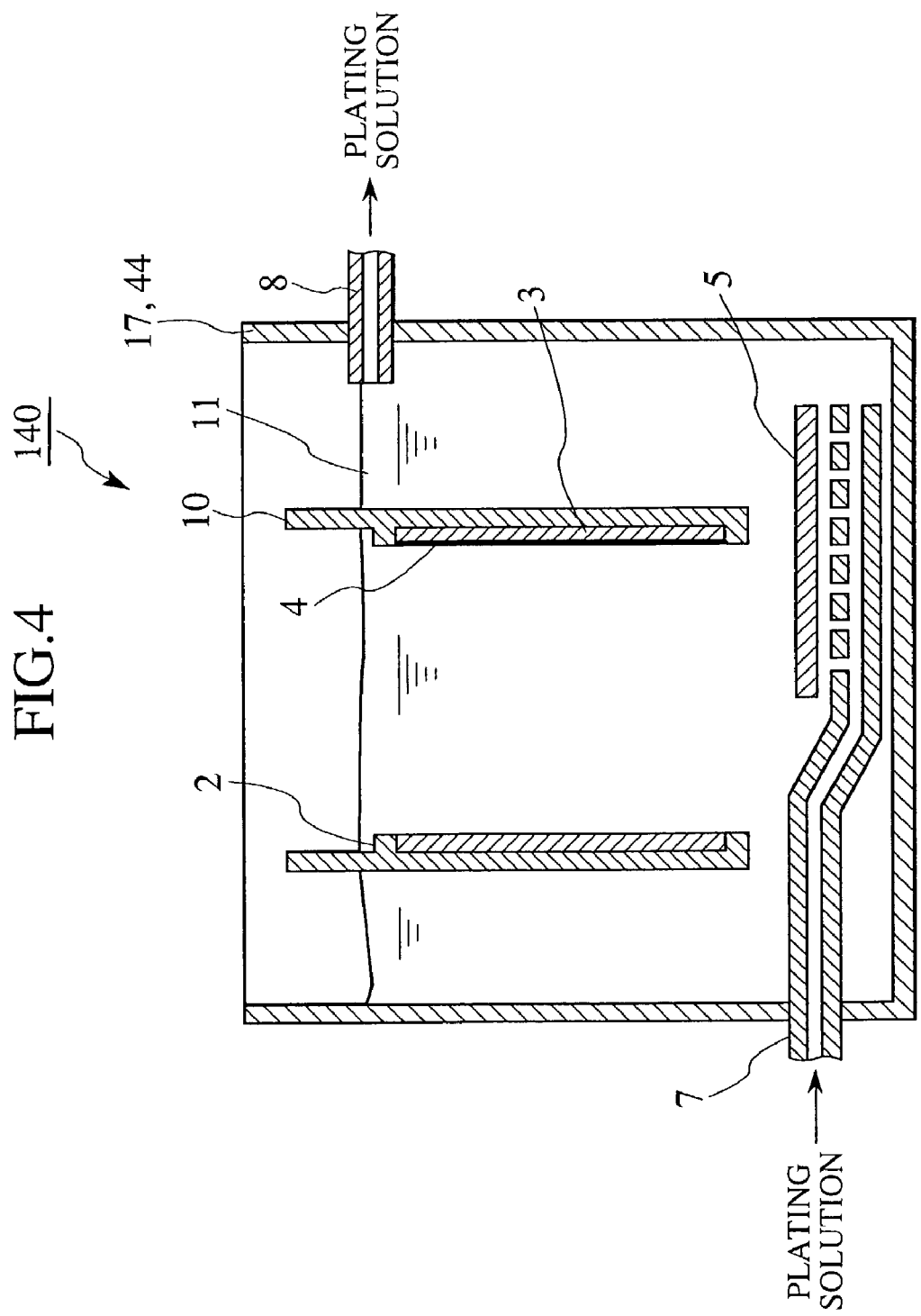
FIG. 4 is a cross section of a vertical plating apparatus according to Example 5 of this invention.

The plating vessel as the chemical solution treatment vessel 17 for conducting plating treatment is disposed on the plating stage 29. The plating stage 29 may comprise a plurality of plating vessels. In addition to the cup-type treatment vessel, a vertical type chemical solution treatment vessel 4, for example, as shown in FIG. 4 may also be used for the chemical solution treatment vessel 17. Also in this case, when the plating treatment is conducted, the anode electrode 2 and the preliminary electrolytic vessel 5 are disposed in the vessel. In each of the figures, wirings and a power source for applying voltage to each of the electrodes are not illustrated.

In the cup-type plating vessel shown in FIG. 3, the preliminary electrolytic electrode 5 is disposed at a central portion of the plating vessel. However, it may be disposed, for example, in the plating solution discharge pipe 7 or near the discharge port thereof so that the preliminary electrolytic electrode 5 comes in contact with the plating solution 11 before the contact of the cathode electrode 3 as the plated body with the plating solution 11. Further, the preliminary electrolytic electrode 5 may be disposed also outside the plating treatment vessel 1, for example, at such a position in the plating solution tank of the plating solution supply system where liquid junction can be taken by way of the plated body and the plating solution.

For the preliminary electrolytic electrode 5, a cylindrical electrode is used for the plating vessel shown in FIG. 3 but only of plateaus, linear, disk-like, annular or spherical shape may be used with no restriction. Further, a plating jig such as a baffle plate having other function may also be used together as the preliminary electrolytic electrode 5. For the material of the preliminary electrolytic electrode, copper is used in the apparatus shown in FIG. 3. However, any of electrode materials may be used such as a metal, for example, Fe, Ni, Pt, W or Ti, or an alloy comprising them metal as the main material may be used so long as it is a conductive material.

The area of the preliminary electrolytic electrode in contact with the plating solution is preferably one-half or more and, suitably, equal with or more than the area for plating area (that is, area for the surface in contact with the plating solution). The preliminary electrolytic electrode may be fixed to the plating vessel but a movable and detachable type is preferred since this facilitates maintenance.

The anode electrode 2 in the plating vessel 1 is disposed at a position opposing to the plated body 3 as the cathode electrode in a state being held on the wafer support portion 10. The cathode electrode 3 and the anode electrode 1 are preferably disposed in parallel so as to obtain a uniform deposition property of the plated film. In FIG. 3, the anode electrode 2 is disposed in the lower portion of the apparatus while the cathode and the electrode 3 is disposed in the upper portion of the apparatus, but this is not restrictive and they may be disposed at any place optionally.

Any material may be used for the anode electrode material 2 such as copper, nickel, iron, platinum or gold so long as it is a conductive material. Further, the anode electrode has an annular (doughnut) shape in the apparatus shown in FIG. 3 but it may be of other shape such as a disk and the size is preferably identical approximately with that of the cathode electrode 3.

Figure 5A:
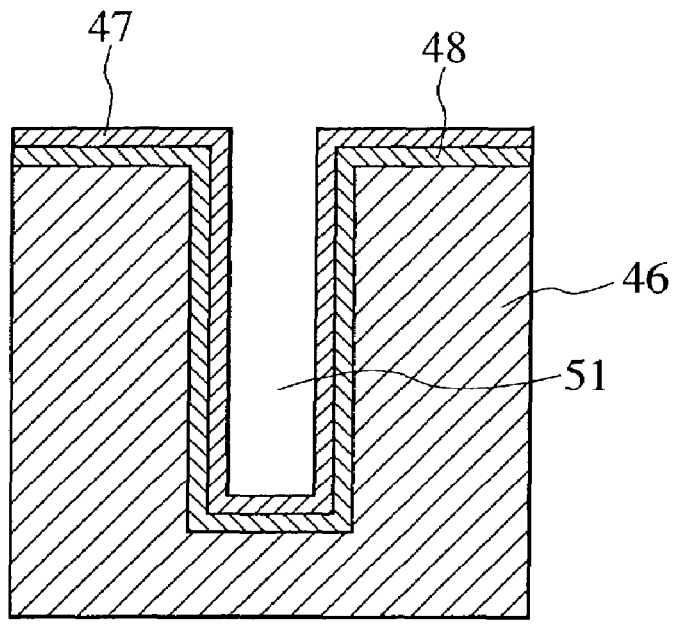
FIG. 5 is an explanatory view illustrating plating treatment in a preferred embodiment.

In a case where the plating apparatus of this embodiment is used for the formation of wirings by a damascene process, a concave portion (for example, groove or hole) for forming copper wirings is formed to the surface of an insulation film 46 as shown in FIG. 5A, and a copper diffusion preventive film 48 and an underlying conductive film 47 for plating are formed on the surface of the groove or the hole. In the example shown in FIG. 5, the underlying film 47 used is formed of copper made into a film by sputtering but a conduction film other than copper may also be used and the method of forming the underlying film is neither restrictive.

Figure 6:
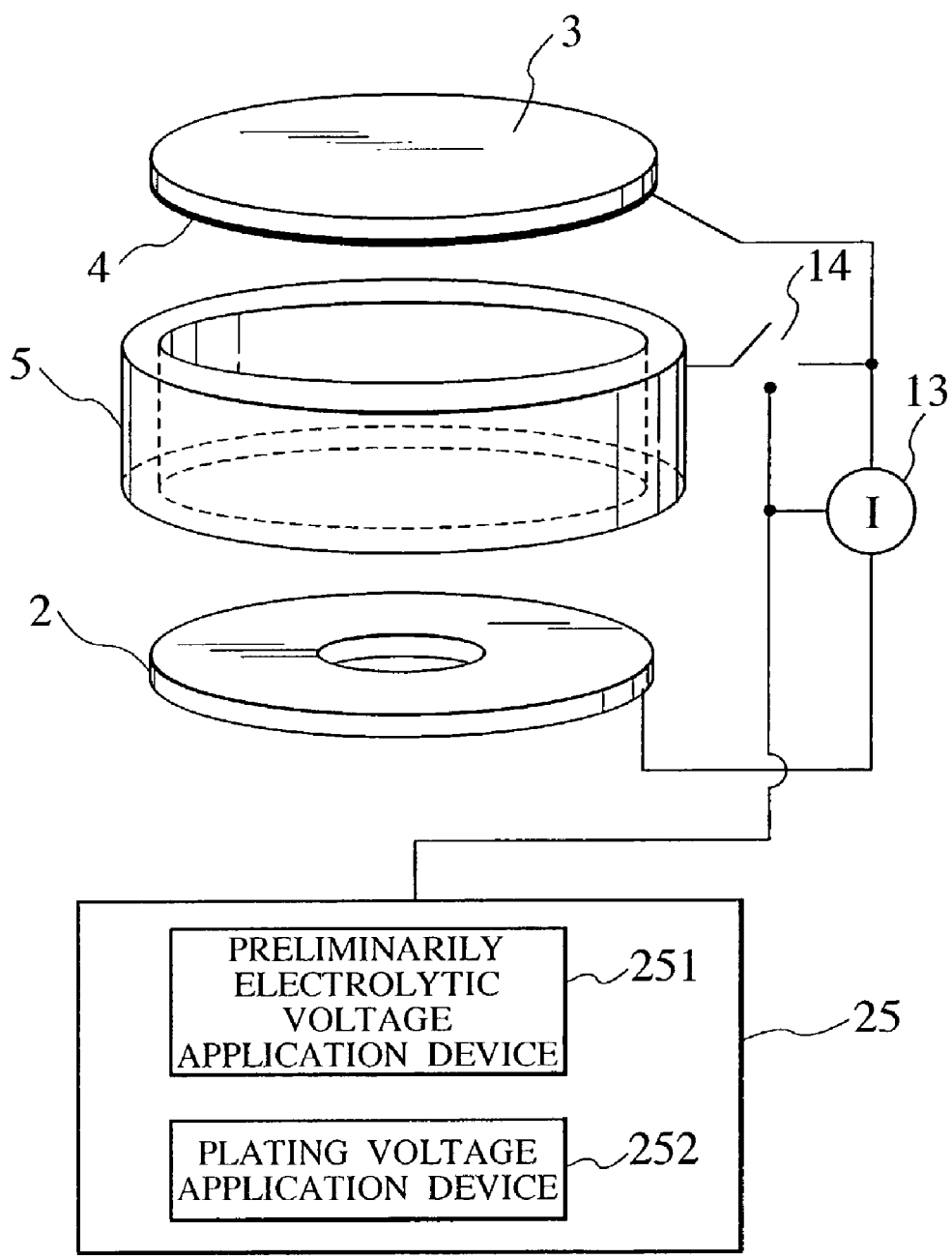
FIG. 6 is an explanatory diagram illustrating the shape of electrodes and a constitutional example of a current circuit in a plating apparatus.

The anode electrode 1 and the cathode electrode 3 establish a circuit by way of a plating solution 11 as shown in FIG. 6 and a voltage can be applied between them by a power source 13. For the power source 13, any current such as DC, AC or pulse current may be used and a DC power source is preferred.

Figure 7:
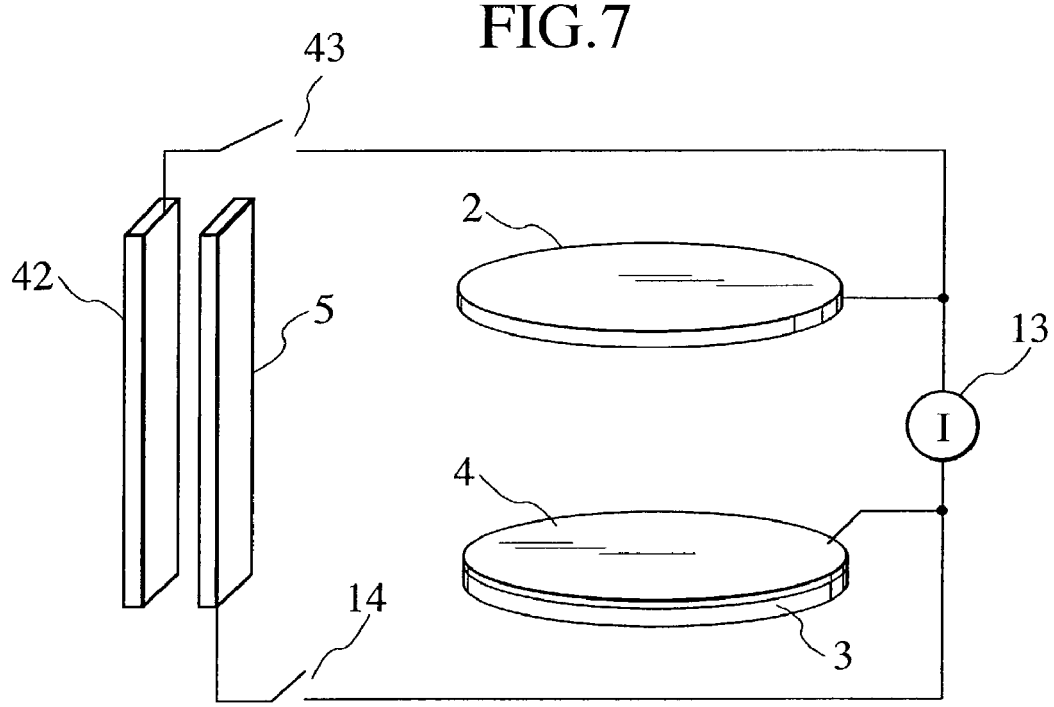
FIG. 7 is an explanatory diagram illustrating the shape of electrodes and a constitutional example of a current circuit in a plating apparatus.

Further, the preliminary electrolytic electrode 5 is disposed in parallel as a current path with the cathode electrode 3 and the preliminary electrolytic electrode 5 can be separated by a switch 14 from the circuit. Further, an auxiliary anode electrode 42 may be added to the constitution as shown in FIG. 7 to establish a circuit between the auxiliary anode 42 and the preliminary electrolytic electrode 5 by way of a switch 43 to constitute a circuit between the auxiliary anode electrode 42 and the preliminary electrolytic electrode 5 such that the preliminary electrolytic electrode 5 and the cathode electrode 9 are disposed in parallel as the current path.

Figure 8:
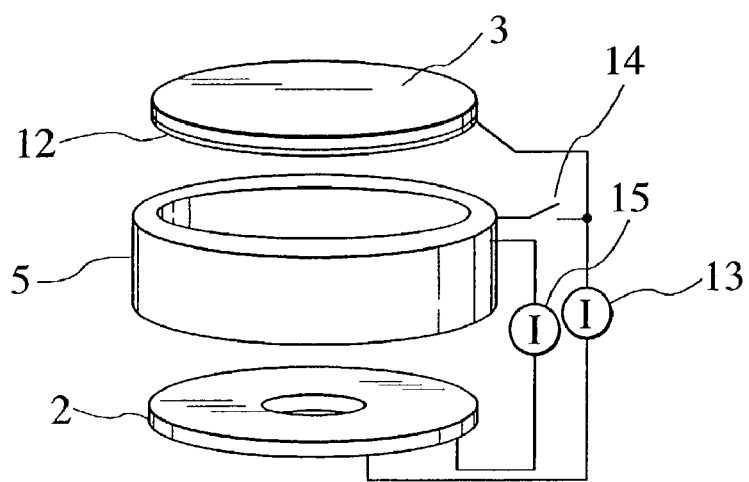
FIG. 8 is an explanatory diagram illustrating the shape of electrodes and a constitutional example of a current circuit in a plating apparatus.

Further, as shown in FIG. 8, a minute current DC current source 15 may be disposed in addition to the power source 13 and located between the preliminary electrolytic electrode (cathode electrode for preliminary electrolytic current) 5 and the anode electrode 5.

Figure 9:
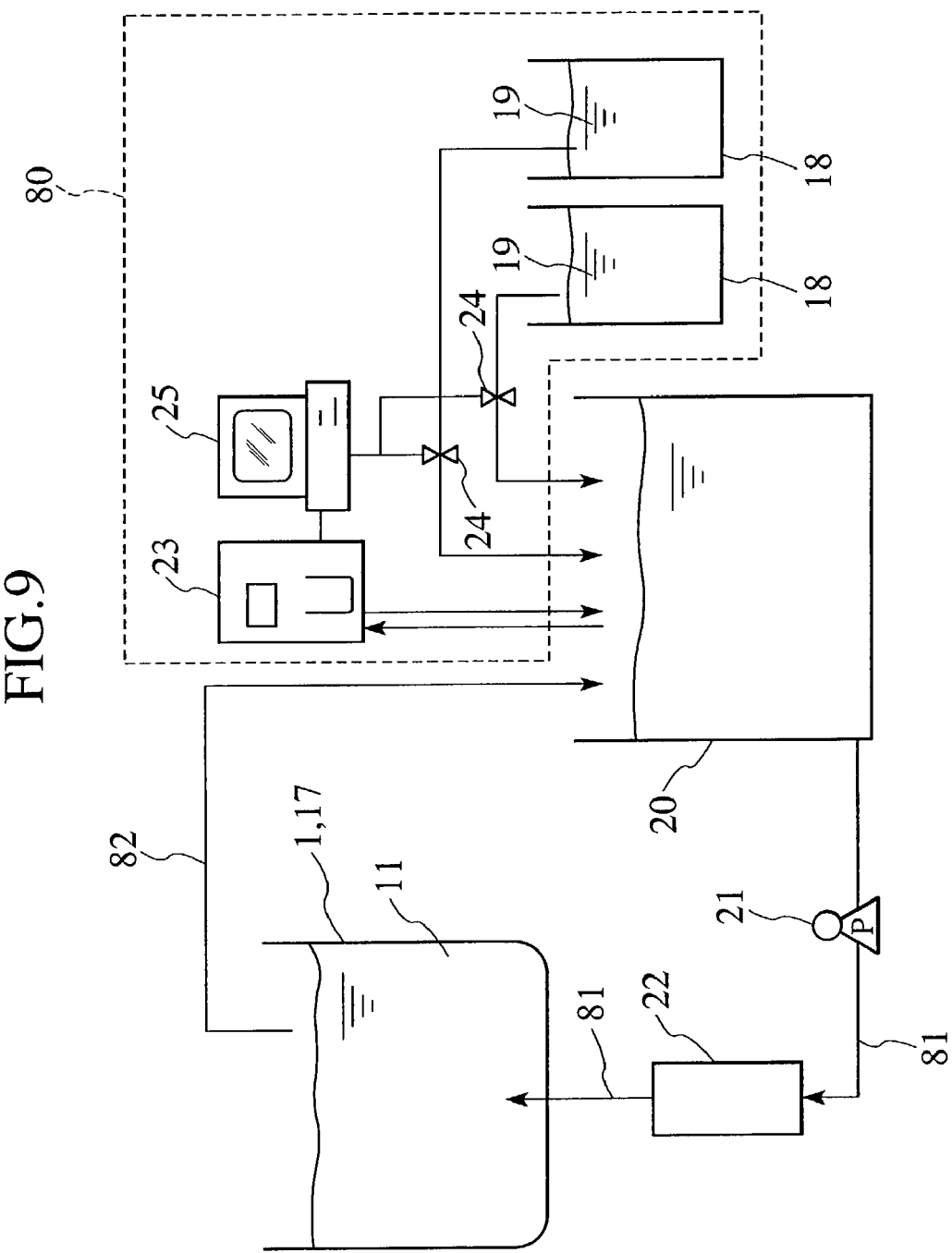
FIG. 9 is a diagram showing a constitution of a chemical solution treatment system and a flow of a chemical solution.

A chemical solution treatment system comprising, for example, as shown in FIG. 9, a chemical solution treatment vessel 17 (plating treatment vessel 1 in the case of the chemical solution treatment vessel 17 on the plating stage 29), a chemical solution tank 20, a chemical solution control system 80 (an analysis section 23, a controlling information processing apparatus (personal computer) 25, a supplementary liquid vessel 18, a solenoid valve 24, etc) may be used. The plating solution tank 20 is preferably provided with a control system 80 having a supplementing mechanism so that a liquid ingredient can be supplemented. The chemical solution tank 20 and the control system 80 may be disposed at a position different from the plating apparatus main body.

As shown in FIG. 9, a plating solution 11 contained in the plating solution tank 20 flows by a supply pump 21 from a plating solution discharge port 7 into a plating vessel 1 and flows from a plating solution discharge portion 8 into the plating solution tank 20. To remove dusts in the plating solution, a filter 22 is preferably disposed in a plating solution pipeline 81 from the plating solution tank 20 to the plating vessel 1 and/or in a plating solution pipeline 82 from the plating vessel 1 to the plating solution tank 20.

B: Operation of the Apparatus

Then, the flow of the treatment in the plating apparatus for each of embodiments is to be explained with reference to FIG. 1. The following treatments are controlled by a controlling information processing device 25. The controlling information-processing device 25 is an information-processing device comprising a central processing unit (CPU), a main memory, an external memory and an input/output unit. The following treatment by the controlling information-processing device 25 is conducted by the execution of a program previously stored in a memory medium such as an optical disk, a magnetic disk or opto-magnetic disk and read into the main memory, but the invention is not restricted only to such execution means by the program.

At first, the transportation manipulator 26 takes out wafers 3 one by one from the wafer supplying cassette 33 placed at the load stage 27, transports a wafer 3 to the pre-plating stage 28 and places the wafer 3 to the plating pre-treatment vessel 34. The plating pre-treatment vessel 34 conducts plating pre-treatment for the wafer 3. Then, the transportation manipulator 26 transports the wafer 3 to the plating stage 29 and sets it to the support portion 10 of the plating vessel 35. A plated film is formed in the plating vessel 35. Successively, the wafer 3 is sent by the transportation manipulator 26 to the cleaning stage 30, applied with the cleaning treatment and then by way of the drying treatment at the drying stage 31 and contained in the recovery cassette 38 at the unload stage 32. The wafer 3 is contained in the recovery cassette 38 at the drying stage 31 and the recovery cassette 38 is unloaded, whereby the size of the apparatus can be reduced.

Figure 10:
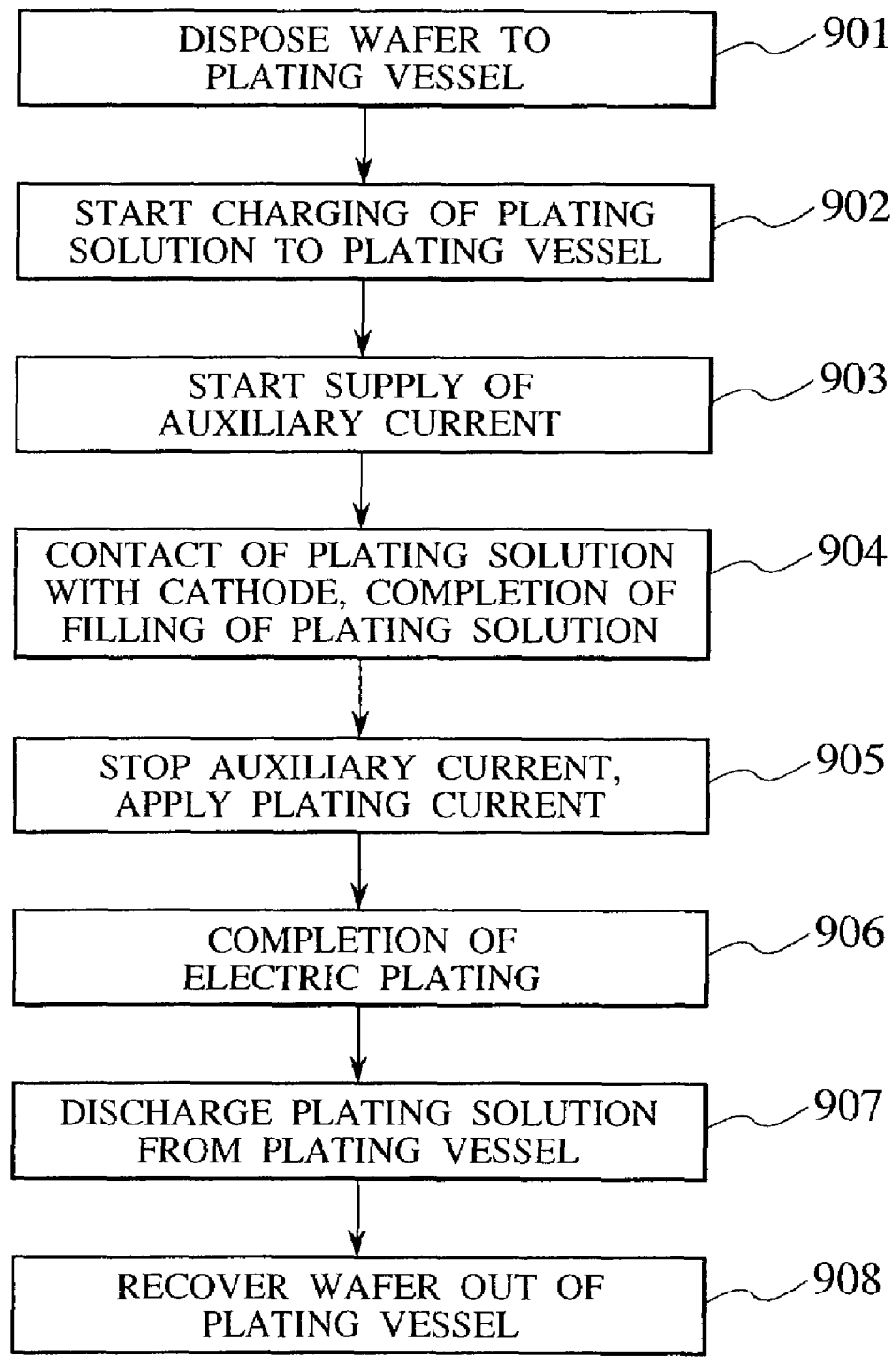
FIG. 10 is a flow chart showing a plating treatment in a preferred embodiment.

Then, plating procedures at the plating stage 29 are to be explained with reference to FIGS. 3 and 10.

The controlling information processing device 25 transports a wafer 3 after completion of the plating pre-treatment at the plating stage 28 by the transportation manipulator 26 to the plating stage 29, and sets the wafer to the wafer support portion 10 at the plating vessel opening (step 901). Subsequently, the controlling information-processing device 25 secures the wafer 3 to the support portion 10 by a wafer-retaining jig 9 so as to restrict the intrusion of the plating solution 11 to the not-plated surface and then starts inflow of the plating solution 11 into the plating vessel 1 (step 902).

The plating solution 11 starting to be accumulated in the plating vessel 1, when the level gage 6 detects that the plating vessel 1 is filled with the plating solution to a depth at which the level gage 6 is placed (however, the cathode electrodes 3 and 4 as the plated body do not yet come in contact with the plating solution 11), the controlling information processing device 25 applies an auxiliary current between the preliminary electrolytic electrode 5 and the anode electrode 2 by a preliminary electrolytic voltage application device 251 (FIG. 6) (step 903). In a case of using a plating vessel of a structure in which the anode electrode 2 comes in contact with the plating solution subsequent to the cathode electrode 3, a minute voltage may be applied between the preliminary electrolytic electrode 5 and the auxiliary anode electrode 42 so as to flow a minute auxiliary current therebetween. Further, the switch 14 disposed between the cathode electrode 3 and the preliminary electrolytic electrode 5 may be turned on at any time before contact of the cathode electrode 3 with the plating solution.

After the operation, the cathode electrode 3 and the plating solution 11 comes in contact with each other and the discharge of the plating solution from the plating vessel 1 is started as soon as filling of the plating solution 11 has been completed (step 904). Charge and discharge of the plating solution 11 is conducted continuously till the plating is completed for the wafer 3. The electric conduction can be established for the cathode electrode 3 with the anode electrode 2 or the auxiliary anode electrode 5 by way of the plating solution 11 and it is in parallel with the preliminary electrolytic electrode 5 as the current path. Accordingly, a minute current flows to the cathode electrode 3 at the same time when it comes in contact with the plating solution 11.

After allowing the minute to flow continuously till the instant plating is applied, the plating voltage application device 252 (FIG. 6) of the controlling information processing device 25 (FIG. 6) applies a plating voltage between the cathode electrode 3 and the anode electrode 2 to start plating and, at the same time, disconnects the preliminary electrolytic electrode 5 from the circuit to stop the flow of the minute current (step 905). Subsequently, plating is applied for a predetermined time till copper is filled in the groove or the hole formed to the surface of the wafer and, after completion of the electric plating (step 906), it stops entrance of the plating solution 11 into the plating vessel 1, discharges the plating solution in the plating vessel 1 (step 907), releases securing of the wafer 3 and carries the wafer to the cleaning stage 30 by the transportation manipulator 26 (step 908). By the procedures described above, formation of the plated film is completed.

EXAMPLE 1

In this example, semiconductor devices were manufactured by using a semiconductor device manufacturing apparatus having a plating apparatus provided with the cup-type plating vessel 1 shown in FIG. 3 on the plating stage 29 and by conducting electrical copper plating by way of batchwise treatment of discharging and charging the plating solution for each plating treatment. The composition of the plating solution 11 used comprised 200 g/dm$^3$ (0.4 mol/dm$^3$) of copper sulfate ($CuSO_4.5H_2O$), 100 g/dm$^3$ (2.0 mol/dm$^3$) of sulfuric acid ($H_2SO_4$), 30 mg/dm$^3$ (1.5×10$^{-3}$ mol/dm$^2$) of chlorine ions and an appropriate amount of additives (10×10$^{-3}$ dm$^3$/dm$^2$ of MICROFAB Cu2100 (manufactured by Nippon Electro Plating Engineers Co.)) and water was used as the solvent. The temperature of the plating solution was set to 25° C. An annular phosphorus-containing copper plate of 300 cm$^2$ was used for the anode electrode and a cylindrical phosphorus-containing copper plate of 1400 cm$^2$ area was used for the preliminary electrolytic electrode 5.

The plated body was prepared as described below. At first, an $SiO_2$ insulation film 46 was deposited to a film thickness of 300 nm by a sputtering process on a silicon wafer substrate of 20.32 cm (8 inch) and a concave portion (groove or hole) 51 was formed on the surface by a photolithography process (FIG. 5A). The width for the concave portion 51 for wiring is formed such that the wiring width was 0.10 μm-1 μm. Successively, after forming a barrier film 48 made of TiN by a sputtering process, copper was deposited as a underlying conductive film 47. The thickness of the obtained barrier metal was 15 nm on the wall surface and 300 nm at the bottom surface of the concave portion 51. Further, the thickness of the underlying conductive film 47 was 10 nm on the wall surface and 30 nm at the bottom surface of the concave portion 51.

The thus prepared wafer 3 as the object for plating was pretreated at the pre-plating stage 28, then transported by the transportation manipulator 26 to the plating stage 29, placed to the support portion 10 of the plating vessel 11 with the plated surface 4 pointing downward (that is, toward the inside of the plating vessel 1) and secured to the support portion 10 by the wafer retaining fid 9.

Then, the plating solution 11 was introduced at a flow rate of 10 dm$^3$/min into the plating vessel 1. At the initial stage of introducing the plating vessel 11, since the plating solution 11 is accumulated from the lower portion of the plating vessel 1, at first the anode electrode and then the preliminary electrolytic electrode 5 comes in contact with the plating solution 11. In this example, the switch 14 between the preliminary electrolytic electrode 5 and the circuit is turned on when the level of the plating solution 11 reached the position of the level gage 6 to allow a minute current to flow from the anode electrode 2 to the preliminary electrolytic electrode 5. The current supplied here is preferably of such a minute current that electric plating does not proceed and, specifically, it is preferably about 0.0001 A/dm$^2$ to 0.2 A/dm$^2$ to the preliminary electrolytic electrode 5. In this example, it was 30 mA (about 0.002 A/dm$^2$ to the preliminary electrolytic electrode 5).

In a state where the minute current flows between the anode electrode 2 and the preliminary electrolytic electrode 5, when the plating solution is gradually filled in the plating vessel 1 and the cathode electrode 3 and the plating solution 11 comes in contact with each other, the minute current flowing so far between the preliminary electrolytic electrode 5 and the anode electrode 2 is divided to the cathode electrode 3 and the preliminary electrolytic electrode 5, so that current flows in parallel also to the cathode electrode 3. This is because the cathode electrode 3 and the preliminary electrolytic electrode 5 are arranged in parallel as the current paths and the potential is equal between both of the electrodes 3 and 5. Therefore, the cathode electrode 3 is at a reducing potential before in contact with the plating solution 11 and when it becomes electrically conductive in contact with the plating solution 11, current is distributed in accordance with the area ratio between the preliminary electrolytic electrode 5 and the cathode electrode 3 and a minute current flows between both of the electrodes 3, 5, and the anode electrode 2. Accordingly, it is preferred that the area of the preliminary electrolytic electrode 5 is made greater as compared with the cathode electrode 3 in order not to allow instantaneous plating current to flow to the cathode electrode 3.

In the plating apparatus of this example, since the plating solution 11 is jetted out in the vessel 1 from the lower portion of the plating vessel 1, the plating liquid surface 11a is higher at the central portion of the plating vessel 1 than the plating solution surface 11b near the wall surface of the plating solution 1. Therefore, the central portion of the cathode electrode 3 as the plated body comes at first in contact with the plating solution. However, since the area of the cathode electrode 3 is smaller as compared with that of the preliminary electrolytic electrode 5, a current sufficient to start the electric plating does not flow to the cathode electrode 3 also at the instance the central portion of the cathode electrode 3 comes in contact with the plating solution 11. Actually, the current at the cathode electrode was a reducing current at about 0.5 mA and the potential on the cathode electrode 3 was about –0.3 V (vs. N.H.E.). In this case, when the area of the preliminary electrolytic electrode 5 is smaller than one-half of the cathode electrode 3, there is a possibility that a current sufficient to start electric plating on the cathode electrode 3 flows. In view of the above, it is preferred that the area for the preliminary electrolytic electrode 5 is larger than one-half of the cathode electrode 3.

Then, the plating solution 11 filled the inside of the plating vessel 1 and the entire surface of the cathode electrode 3 came in contact with the plating solution 11. The reducing current flowing to the cathode electrode 3 in this state was 7 mA (about 0.002 A/dm$^2$ for the cathode electrode 3) and the cathode electrode 3 was at a potential of about –0.3 V (vs. N.H.E). As a result, copper oxides on the surface of the underlying film 47 formed on the cathode electrode 3 as the plated body was reduced into copper with no dissolution. In this state, the thickness of the underlying conductive film 47 was 10 nm on the wall surface and 30 nm at the bottom surface of the concave portion 51. Further, there was no locally dissolved portion of the underlying film 47.

Figure 5B:
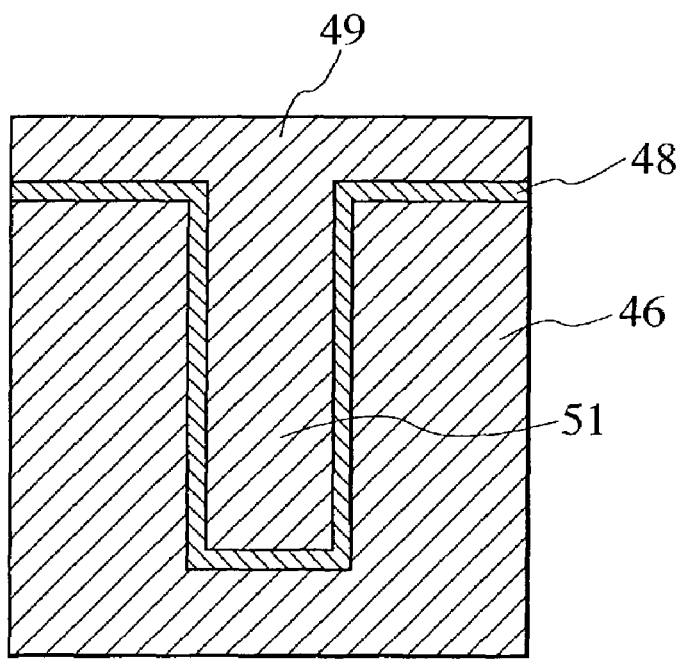

Then, the plating solution 11 was overflown from the plating solution discharge port 8 in the upper portion of the plating vessel 1 and started to be discharged. Charge and discharge of the plating solution 11 was continued till the end of the formation of the plated film in order to keep the ingredient of the plating solution 11 constant. After waiting for about 20 sec till bubbles and the like on the surface of the cathode electrode 3 were discharged, the switch 14 between the preliminary electrolytic electrode 5 and the DC power source 13 was disconnected and, at the same time, current of about 3 A (1 A/dm$^2$) was supplied between the anode electrode 2 and the cathode electrode 3 to fill the concave portion 51 for wirings with copper as shown in FIG. 5B. Thus, a copper film 49 as the wirings could be formed. Since the thus formed copper film 49 was deposited on the uniform underlying film 47, the concave portion 51 could be filled completely without leaving voids and the like in the inside.

Then, the plating solution remaining on the surface of the plated body 3 was removed and cleaned at the cleaning stage 30, the wafer was dried at the drying stage 31 and the wafer 3 unloaded from the unload stage 32 was taken out.

As a result of electron microscopic observation for the cross section of the thus formed wafer 3, defects such as voids were scarcely observed as shown in FIG. 5B and it has been found that the portion 51 for wirings could be filled at good reliability and, further, a plated film of uniform thickness could be obtained. Table 1 shows the results of evaluation.

TABLE 1

| | | Number of voids in the wafer by cross sectional observation after plating | |
|---|---|---|---|
| | Dissolution of underlying film | Wafer center (N) | Wafer periphery (N) |
| Example 1 | no | 2 | 1 |
| Example 2 | no | 1 | 0 |
| Example 3 | no | 2 | 1 |
| Example 4 | no | 1 | 1 |
| Example 5 | no | 1 | 2 |
| Example 6 | no | 2 | 1 |
| Example 7 | no | 2 | 3 |
| Comp. Example 1 | Present more in the wafer central portion | 451 | 151 |
| Comp. Example 2 | Present over the entire surface | 400 | 320 |

EXAMPLE 2

Figure 11:
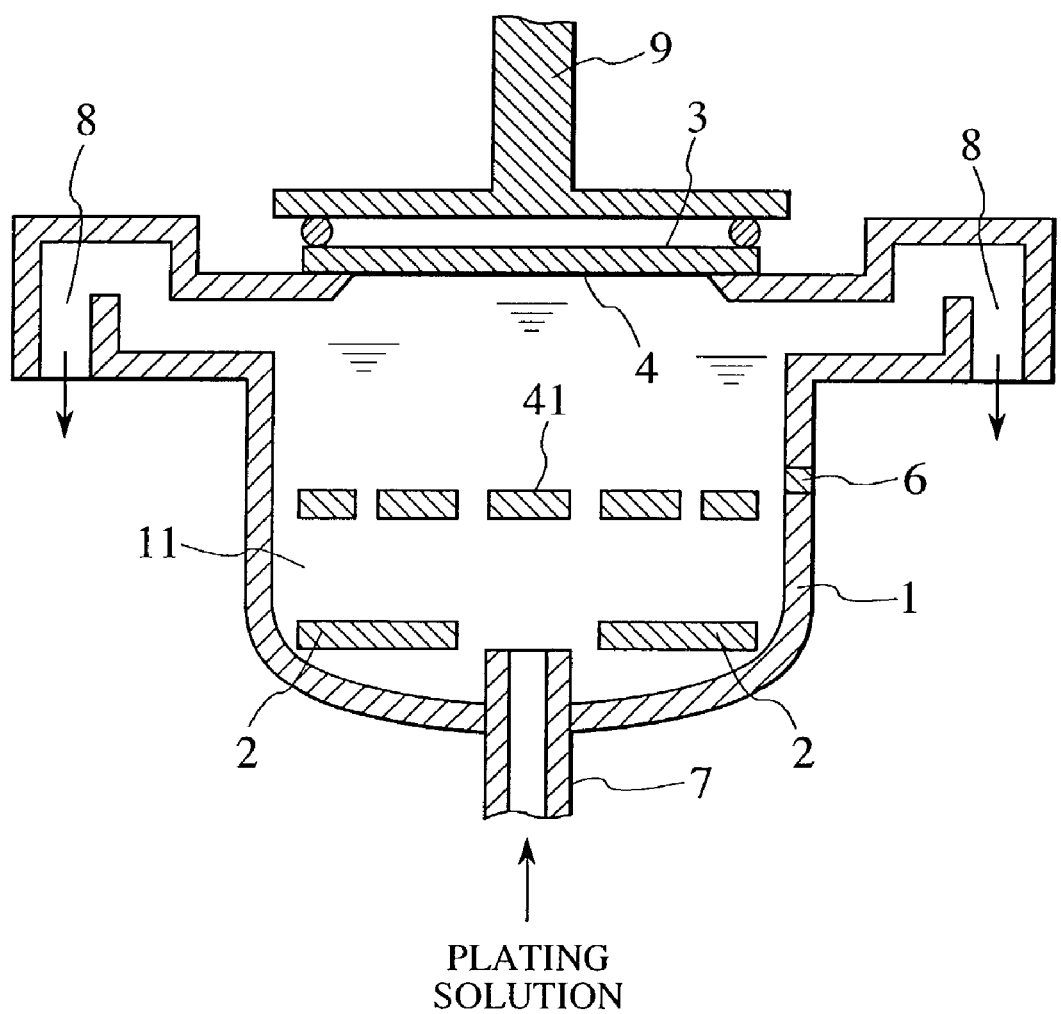
FIG. 11 is a cross section of a cup-type plating apparatus in Example 2 of this invention.

In this example, as shown in FIG. 11, copper plating was conducted in the same manner as in Example 1 by using a cup-type plating apparatus having a disk-like preliminary electrolytic electrode 41 with through holes instead of the cylindrical preliminary electrolytic electrode 5 in the plating vessel 1. The preliminary electrolytic electrode 41 used in this example is a disk made of phosphorus-containing copper sized 20.32 cm (8 inch) in diameter, having through holes each 2 cm in diameter perforated by the number of 15 in the disk which also functions as a baffle plate. The composition of the plating solution and the plating conditions adopted in this example are identical with those of Example 1. In this example, an annular phosphorus-containing copper plate of 300 cm$^2$ in area was used as the anode electrode 2 and a disk-shaped phosphorus-containing copper plate of 530 cm$^2$ area was used as the preliminary electrolytic electrode (baffle plate) 41.

Figure 12:
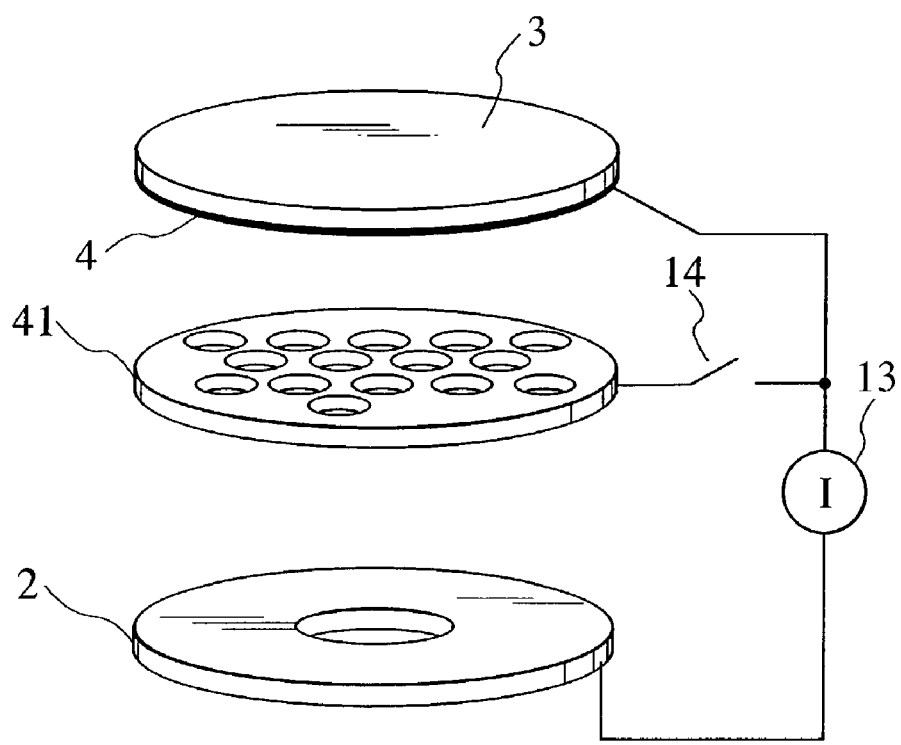
FIG. 12 is an explanatory diagram illustrating the shape of electrodes and a constitutional example of a current circuit in a plating apparatus of Example 2.

In the plating apparatus of this example, as shown in FIG. 12, a wafer 3 as a cathode electrode and a baffle plate 41, and an anode electrode 2 constitute a circuit by way of a plating solution 11 and in a state of closing the switch disposed between the baffle plate 41 and the power source 13, the wafer 3 and the baffle plate 41 are in parallel as the current path.

The plated body 3 prepared in the same manner as in Example 1, by deposition of an SiO$_2$ insulation film 46 on the wafer surface, fabrication of a concave portion 51 for wiring, formation of a barrier film 48 and film deposition of copper as the underlying conductive film 47 successively. The thickness of the thus obtained barrier metal 48 and the underlying conductive film 47 was identical with that in Example 1.

After pre-treating the thus obtained plated body 3 at the pre-plating stage 28, it was transported by the transportation manipulator 26 to the plating stage 29, placed at the support portion 10 of the plating vessel 1 with the plated surface 4 pointing downward (that is, to the inside of the plating vessel 1), and secured to the support portion 10 by way of the wafer retaining jig 9.

Then, a plating solution was introduced into the plating vessel 1 at a flow rate of 10 dm$^3$/min. Also in this example, since the plating solution is accumulated from the lower portion of the plating vessel 1 at the initial stage of introducing the plating solution, at first the anode electrode 2 and, successively, the baffle plate and the preliminary electrolytic electrode 41 come in contact with the plating solution 11. In this example, when the level of the plating solution 11 reached a position of the level gage 6, the switch 14 between the baffle plate and the preliminary electrolytic electrode 41 was turned on to allow a minute current to flow from the anode electrode 2 to the preliminary electrolytic electrode 41 at 10 mA (about 0.002 A/dm$^2$ to the preliminary electrolytic electrode).

Successively, in the same manner as in Example 1, after lapse of about 20 sec from the instant the plating solution 11 filled the inside of the vessel 1, the switch 14 between the preliminary electrolytic electrode 41 and the DC power source 13 was turned off and, at the same time, about 3 A (1 A/dm$^2$) of current was allowed to flow between the anode electrode and the cathode electrode 3. Then, copper plating was conducted and copper was filled in the concave portion 51 for wirings. Also in this example, uniform copper film for wirings could be formed without leaving voids in the same manner as in Example 1.

Then, the plating solution remaining on the surface of the plated body 3 was removed and cleaned at the cleaning stage 30, the wafer 3 was dried at the drying stage 31 and the wafer 3 unloaded from the unload stage 32 was taken out.

As a result of electron microscopic observation for the cross section of the obtained wafer 3, defects such as voids were not observed as shown in FIG. 5B like that in Example 1 and it has been found that the concave portion 51 of the wirings was filled with copper 49 at good reliability. Further, in this example, since the baffle plate 41 was used, variations in the plating film thickness within the surface of the wafer 3 as the plated body could also be reduced. Table 1 shows the results of evaluation for the wafer obtained by this example.

EXAMPLE 3

Figure 13:
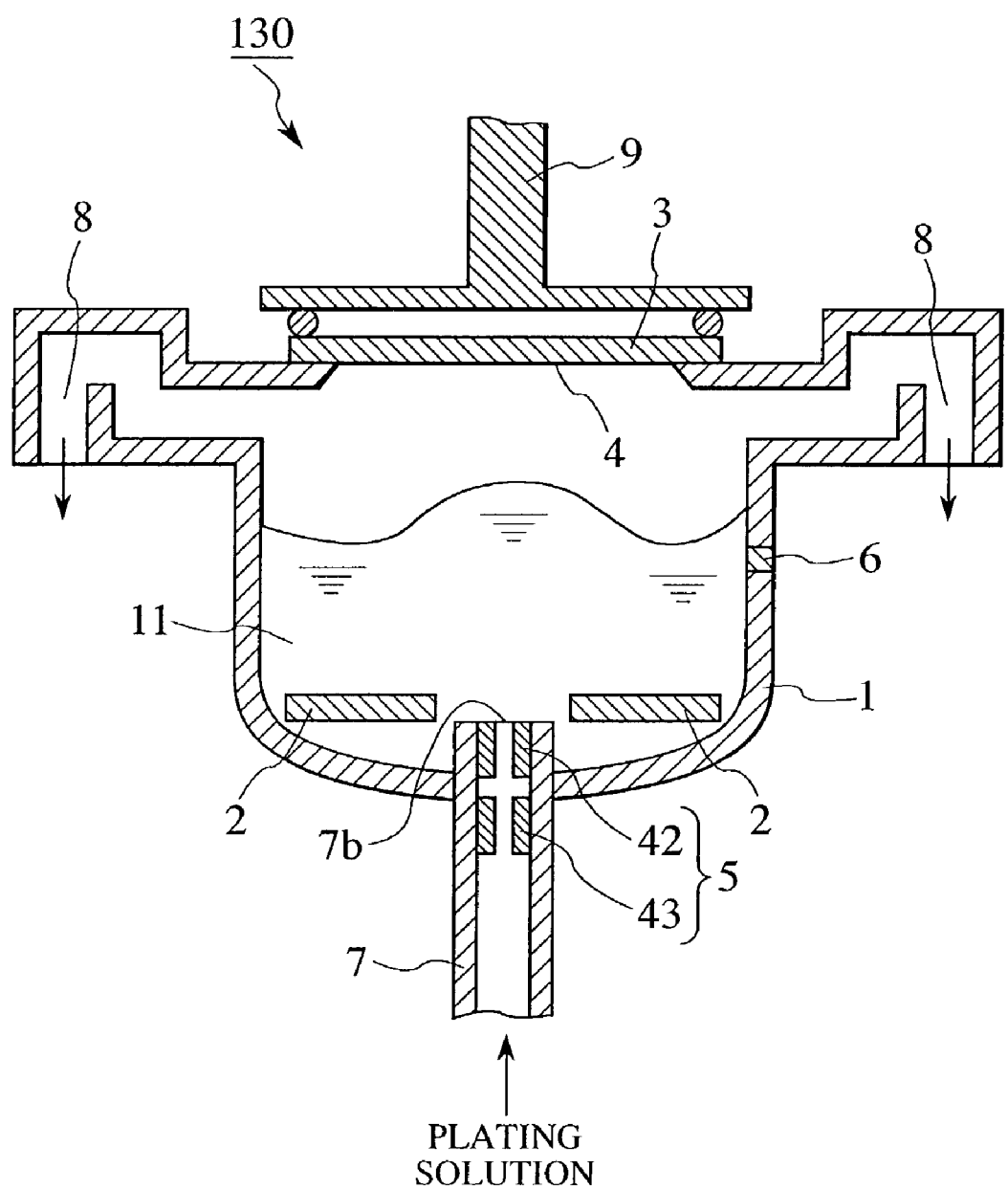
FIG. 13 is a cross section of a cup-type plating apparatus used in Example 3 of this invention.

In this example 3, electrical copper plating was conducted in the same manner as in Example 1 using a cup-type plating apparatus 130 shown in FIG. 13 in the same manner as in Example 1. The composition of the plating solution 11 and the plating conditions, the anode electrode 2 and the cathode electrode 3 as the plated body are identical with those in Example 1.

In the plating apparatus 130 of this example, both a preliminary anode electrode 42 and a preliminary cathode electrode 43 are disposed as the preliminary electrolytic electrode 5. A cylinder made of phosphorus-containing copper with an area of 300 cm$^2$ was used for the preliminary anode electrode 42, and a cylinder made of phosphorus-containing copper with an area of 500 cm$^2$ was used for the preliminary cathode electrode 43, and the preliminary anode electrode 42 and the preliminary cathode electrode 43 were arranged in this order from the side of the discharge port 7b in the vicinity of the discharge port 7b in a plating solution introducing pipeline 7. In this example, while the preliminary anode electrode 42 and the preliminary cathode electrode 43 were disposed each by one, but they may be disposed each by plurality since a flat plated surface can be obtained.

Figure 14:
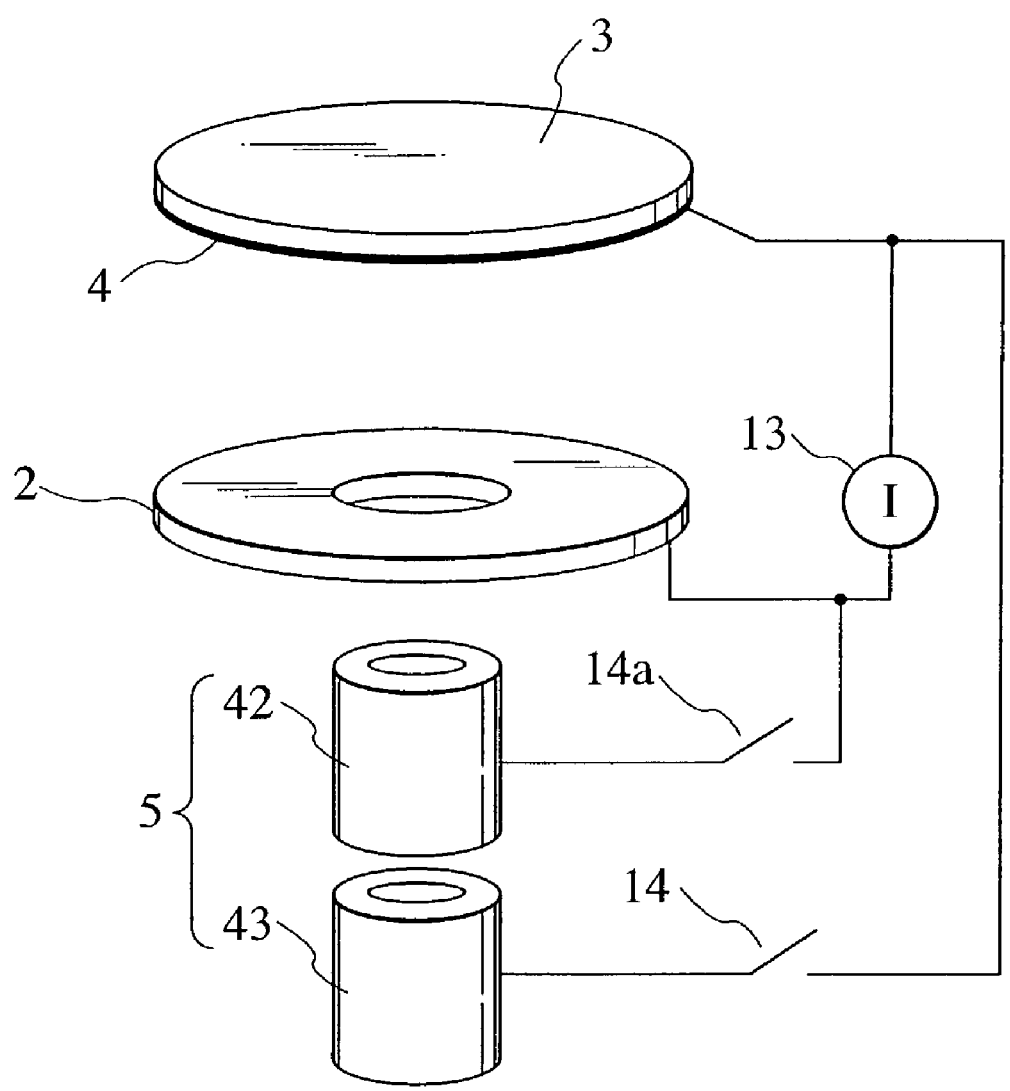
FIG. 14 is an explanatory diagram illustrating the shape of electrodes and a constitutional example of a current circuit in a plating apparatus of Example 3.

In the plating apparatus 130 of this example, as shown in FIG. 14, the preliminary anode electrode 42 is disposed in parallel with the anode electrode 2, and the preliminary cathode electrode 43 is disposed in parallel with the cathode electrode 3 each as the current path, respectively. The preliminary anode electrode 42 and the preliminary cathode electrode 43 can be disposed at any place, for example, in the inside of the plating solution tank so long as liquid junction can be obtained with the anode electrode 2 and the wafer 3 as the plated body by way of the plating solution 11.

In this example, before introduction of the plating solution 11 into the plating vessel 1, the preliminary anode electrode 42 and the preliminary cathode electrode 43 come in contact with the plating solution 11. In view of the above, at first, the switch 14 between the preliminary cathode electrode 43 and the circuit and the switch 14a between the preliminary anode electrode 42 and the circuit are turned on, and a minute current at 10 mA (about 0.002 A/dm$^2$ to the preliminary cathode electrode 43) was supplied from the preliminary anode electrode 42 to the preliminary cathode electrode 43 (about 0.002 A/dm$^2$ to the preliminary cathode electrode 43).

Successively, the plating solution 11 was charged at a flow rate of 10 dm$^3$/min into the plating solution 1 and after lapse of about 20 sec from the instant filling the inside of the plating vessel 1 in the same manner as Example 1, the switches 14 and 14a were disconnected respectively and, at the same time, a current at about 3 A (1 A/dm$^2$) was supplied between the anode electrode 1 and the cathode electrode 3. Thus, a copper film 49 as wirings could be formed on the surface of the underlying film 47 while being kept at a uniform film thickness. Accordingly, in this example, the concave portion 51 for wirings can be filled uniformly without leaving voids, and wirings at high reliability with no short circuit or disconnection could be formed.

Then, the plating solution remaining on the surface of the plated body 3 was removed and cleaned at the cleaning stage 30, the wafer was dried at the drying stage 31 and the wafer 3 unloaded from the unload stage 32 was taken out.

As a result of electron microscopic observation for the cross section of the obtained wafer 3, defects such as voids were not observed like in Example 1. Table 1 shows the results of evaluation for the wafer obtained in this example.

EXAMPLE 4

Figure 15:
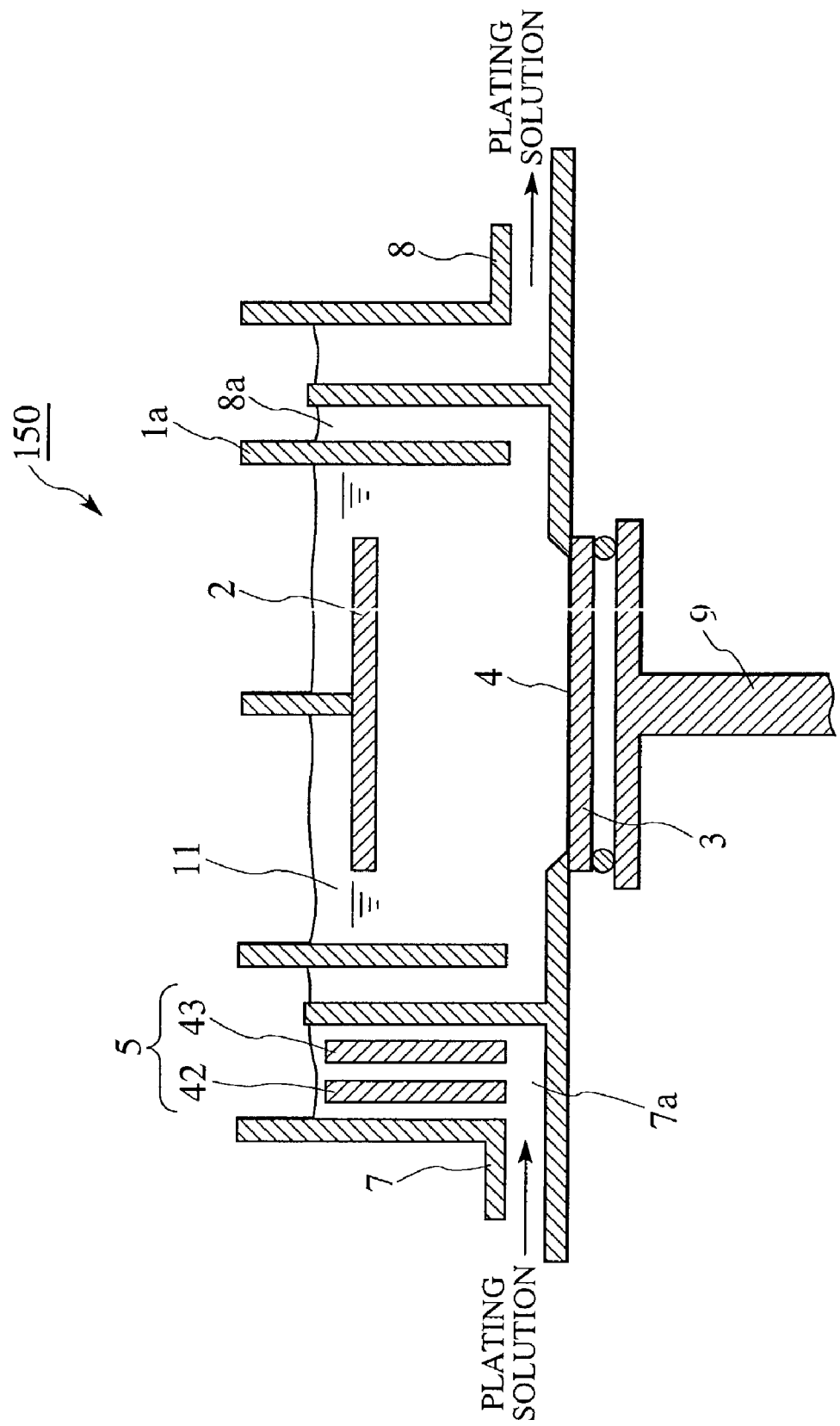
FIG. 15 is a cross section of a cup-type plating apparatus used in Example 4 of this invention.

In the semiconductor device manufacturing apparatus of this example, a plating apparatus 150 having a cup-type plating vessel 1a shown in FIG. 15 was disposed on the plating stage 29. In the apparatus 150 of this example, the anode electrode 2 was disposed in the upper portion of the plating vessel 1a and a wafer 3 as the plated body was urged and secured to the bottom of the plating vessel 1a by the wafer retaining fid 9 such that the plated surface 4 was exposed in the inside of the plating vessel 1a from an opening provided at the bottom of the plating vessel 1a. Further, the plating apparatus 150 of this example comprises a preliminary anode electrode 42 and a preliminary cathode electrode 43 as the preliminary electrolytic electrode 5 in the plating vessel 1a. A phosphorus-containing copper plate of 400 cm$^2$ in area was used for the preliminary cathode electrode 43 and a phosphorus-containing copper plate of 300 cm$^2$ in area was used for the preliminary anode electrode 42.

A copper film for wirings was formed in the wafer with the composition of the plating solution 11 and under the plating conditions identical with those in Example 1. As shown in FIG. 15, the preliminary cathode electrode 43 and the preliminary anode electrode 42 were disposed respectively in a liquid reservoir 7a disposed at the introduction port of the plating solution 11. In the plating apparatus 150 of this example, the plating solution was at first introduced into the plating solution reservoir 7a and the plating solution 11 filled into and overflown from the plating solution reservoir 7a was introduced into the plating vessel 1a.

Also in this example, when introduction of the plating solution 11 to the plating vessel 1a was started, the preliminary cathode electrode 43 and the preliminary anode electrode 42 came in contact with the plating solution 11 before contact of the cathode electrode 3 with the plating solution 11. In this example, after the electric conduction between both of the preliminary electrolytic electrodes 42 and 43 through the coating solution 11, a current at 8 mA (about 0.002 A/dm$^2$ to the preliminary cathode electrode 43) was supplied from the preliminary anode electrode 42 to the preliminary cathode electrode 43. Since the plating solution 11 was gradually charged into the plating vessel in a state where minute current flows between both of the preliminary electrolytic electrode 42 and 43, and the cathode electrode 3 and the plating solution 11 came in contact with each other, as soon as the cathode electrode 3 came in contact with the plating solution 11, the minute current flowing so far between the preliminary electrolytic electrodes 42 and 43 was divided to the cathode electrode 3 and the preliminary cathode electrode 43 and a current flowed in parallel also to the cathode electrode 3.

Subsequently, when the plating solution 11 was accumulated sufficiently in the plating vessel 1a, the anode electrode 2 was immersed in the plating solution 11 and the plating solution 11 overflowed through the plating solution discharge port 8a in the upper portion of the plating vessel 1a and was discharged from the discharge pipeline 8.

Then, the switch between the preliminary anode electrode 42 and the anode electrode 2 and the switch between the preliminary cathode electrode 43 and the cathode electrode 3 were disconnected, respectively, and, at the same time, a current at about 3 A (1 A/dm$^2$) was supplied between the anode electrode 2 and the cathode electrode 3. Thus, a copper plated film for wirings completely filling the concave portion for wirings could be formed while maintaining the thickness of the underlying film uniform as it was.

Then, the plating solution remaining on the surface of the plated body 3 was removed and cleaned at the cleaning stage 30, the wafer was dried at the drying stage 31 and the wafer 3 unloaded from the unload stage 32 was taken out. As a result of electron microscopic observation for the cross section of the obtained wafer 3, defects such as voids were not observed like in Example 1. Table 1 shows the results of evaluation for the wafer obtained in this example.

EXAMPLE 5

In Example 5, copper plating was applied to a wafer, in the same manner as in Example 1, by using a plating apparatus 140 having a vertical plating vessel 44 shown in FIG. 4 on the plating stage 29. The composition of the plating solution 11 and plating conditions, and the anode electrode 2 and the wafer 3 as the object of plating used were identical with those in Example 1.

Figure 16:
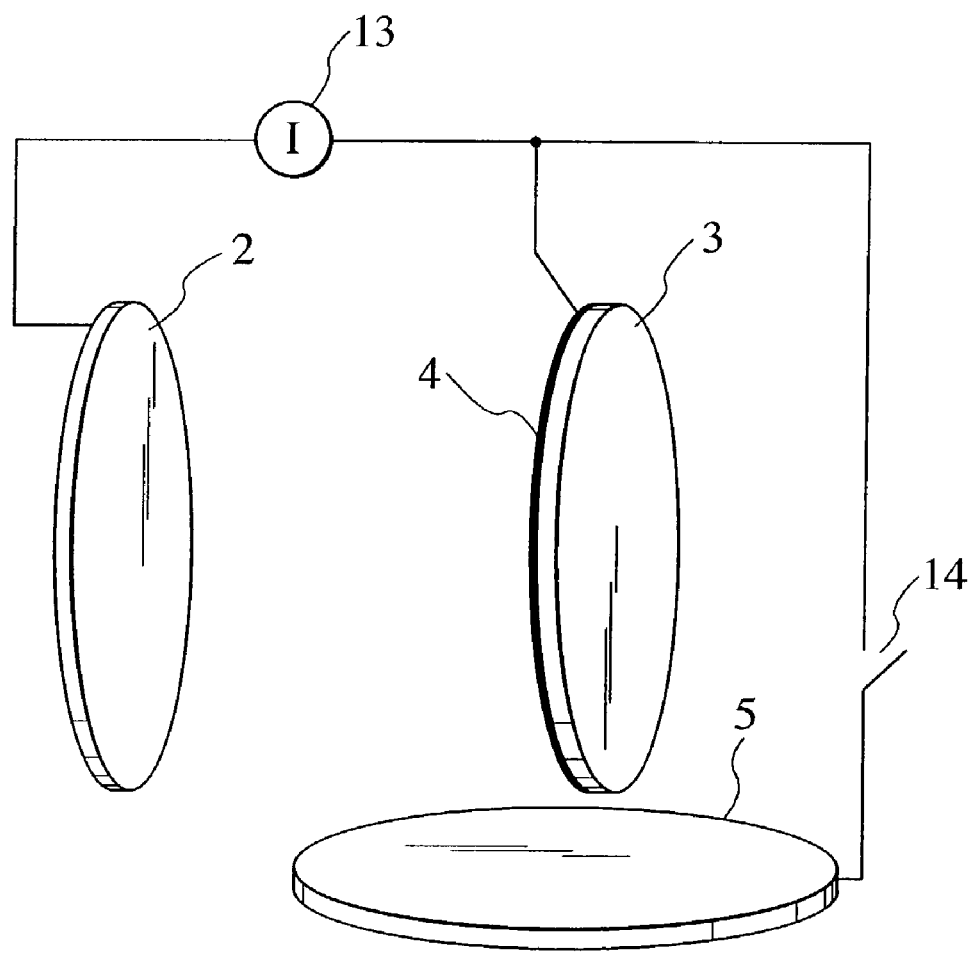
FIG. 16 is an explanatory diagram illustrating the shape of electrodes and a constitutional example of a current circuit used in a vertical type plating apparatus of Example 5.

In the vertical plating vessel 44 in this example, a plating solution introduction pipeline 7 having a plurality of plating solution discharge ports in the upper portion thereof was disposed in a one-side-open-rectangle at the bottom of the plating vessel 44 on which a preliminary electrolytic electrode 5 was disposed. In this example, a phosphorus-containing copper plate of 500 cm$^2$ in area was used for the preliminary electrolytic electrode 5. As shown in FIG. 16, the preliminary electrolytic electrode 5 of this example functioned as a cathode electrode for preliminary electrolytic current.

Further, in the vertical plating vessel 44 of this example, the anode electrode 2 was disposed vertically at a completely immersed position in the plating solution when the plating solution 11 was filled, and a support portion (plating jig) 10 for supporting the plated article (wafer) 3 as the cathode electrode was attached at a position opposing to the anode electrode 2.

In this example, while the anode electrode 2 and the cathode electrode 3 were disposed vertically in the plating vessel 44 (that is, the electrode surface and the plated surface are vertical to the liquid surface of the plating solution 11), both of them may also be disposed laterally (that is, the electrode surface and the plated surface are in parallel with the liquid surface of the plating solution 11).

In this example, the plating solution 11 was at first introduced into the plating vessel 44, the switch 14 between the preliminary electrolytic electrode 5 and the circuit was turned on in a state where the anode electrode 2 and the preliminary electrolytic electrode 5 were already immersed in the plating solution 11 to allow a minute current to flow from the anode electrode 2 to the preliminary electrolytic electrode 5 at 10 mA (about 0.002 A/dm$^2$ to the preliminary electrolytic electrode). On the other hand, the wafer 3 as the plated body was transported from the pre-plating stage 28 to the plating stage 29 by the transportation manipulator 26 and fixed to the plating jig 10.

Successively, while allowing the minute current to flow, the plated body 3 attached to the plating jig 10 was placed in the plating vessel 41 and fixed at a predetermined position opposing to the anode electrode 2 in the plating solution 11. Then, the switch 14 between the preliminary electrolytic electrode 5 and the anode electrode 2 was disconnected, and at the same time, a current at about 3 A (1 A/dm$^2$) was supplied between the anode electrode 2 and the cathode electrode 3. Thus, a plated film for wirings completely filling the concave portion for wirings could be formed while keeping the thickness of the underlying film uniform.

Then, the plating solution remaining on the surface of the plated body 3 was removed and cleaned at the cleaning stage 30, the wafer was dried at the drying stage 31 and the wafer 3 unloaded from the unload stage 32 was taken out. As a result of electron microscopic observation for the cross section of the obtained wafer 3, defects such as voids were not observed like in Example 1. Table 1 shows the results of evaluation for the wafer obtained in this example.

EXAMPLE 6

In Example 6, a copper plated film 48 was formed in the same manner as in Example 1 excepting that the underlying conductive film 47 was a cobalt alloy film formed by an electroless plating method.

The underlying conductive film was formed as described below. At first, after forming the insulation film, the concave portion for wirings and the barrier layer successively on the surface of the substrate in the same manner as in Example 1, a palladium layer was formed by a wet process as a catalytic layer for electroless plating. To be more specific, after immersing the substrate in a 50% hydrochloric acid for 2 min, it was immersed at room temperature for five minutes in a palladium complex type sensitizer (HS-202B manufactured by Hitachi Chemical Co., Ltd.) and then water washed with purified water. Then, the substrate was immersed at a normal temperature for 5 min in an activating treatment liquid (ADP-601 manufactured by Hitachi Chemical Co., Ltd.) and then cleaned with purified water.

Successively, plating treatment was conducted in the same manner as in Example 1 using a plating solution containing 0.1 mol/dm$^3$ of cobalt chloride, 0.3 mol/dm$^3$ of trisodium citrate, 0.06 mol/dm$^3$ of dimethylamine borane, 0.03 mol/dm$^3$ of sodium tungstate and 0.05 g/dm$^3$ of a surfactant RE610 manufactured by Toho Chemical Industry Co., Ltd. Plating was conducted at a pH of 9.5 (adjusted with KOH), at a solution temperature of 60° C., and for a plating time of 7 min. Thus, an underlying conductive film 47 made of a cobalt alloy was formed.

When the substrate having the thus obtained underlying conductive film 47 was put to electrical copper plating treatment in the same manner as in Example 1, dissolution of the underlying conductive film 47 was not observed and a copper film 49 for wirings with no voids in which the concave portion for wirings was completely filled while keeping the thickness of the underlying film uniform could be formed.

Then, the plating solution remaining on the surface of the plated body 3 was removed and cleaned at the cleaning stage 30, the wafer was dried at the drying stage 31 and the wafer 3 unloaded from the unload stage 32 was taken out. As a result of electron microscopic observation for the cross section of the obtained wafer 3, defects such as voids were not observed like in Example 1. Table 1 shows the results of evaluation for the wafer obtained in this example.

EXAMPLE 7

Figure 17:
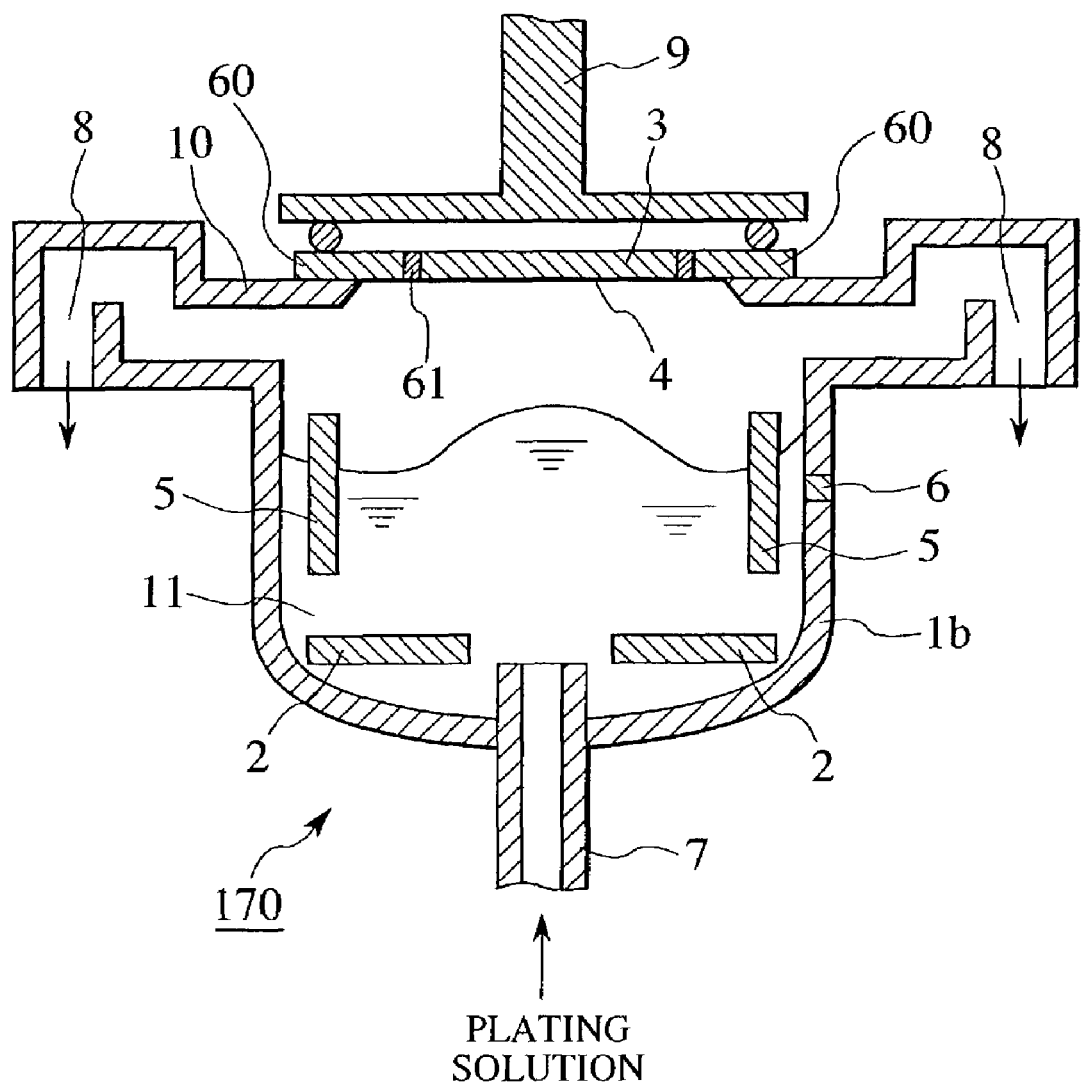
FIG. 17 is a cross section of a cup-type plating apparatus used in Example 7 of this invention.
Figure 18:
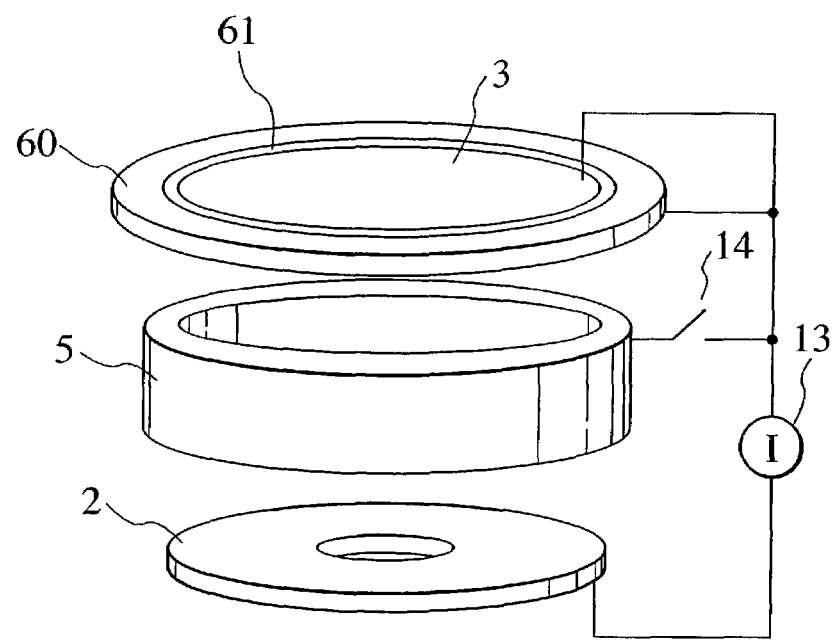
FIG. 18 is an explanatory diagram illustrating the shape of electrodes and a constitutional example of a current circuit in a plating apparatus of Example 7.

In a semiconductor device manufacturing apparatus of Example 7, a plating apparatus 170 having a cup-type plating vessel 1b shown in FIG. 17 was disposed on the plating stage 29. The plating vessel 1b of this example had substantially the same constitution as in the plating vessel 1 used in Example 1 except that an annular auxiliary cathode electrode 60 is provided. That is, in the plating vessel 1b of this example, the annular auxiliary cathode electrode 60 having an insulation portion 61 at the inner circumference was disposed and a wafer 3 as a plated body was placed on a wafer support portion 10 in a state it is fitted into a through hole at the central portion of the auxiliary cathode electrode 60 by way of the insulation portion 61 and fixed by a retaining jig 9. The auxiliary cathode electrode 60 was connected as shown in FIG. 18 with a power source 13 in parallel with the plated body 3 as a current path.

Figure 19:
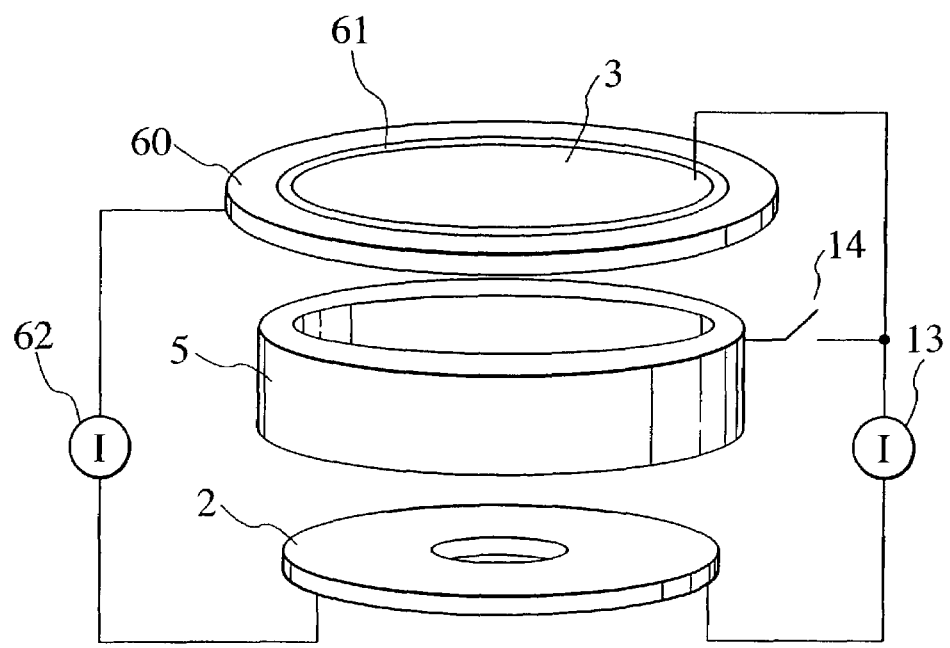
FIG. 19 is an explanatory diagram showing another example of the shape of electrodes and a current circuit in the plating apparatus of Example 7.
Figure 20A:
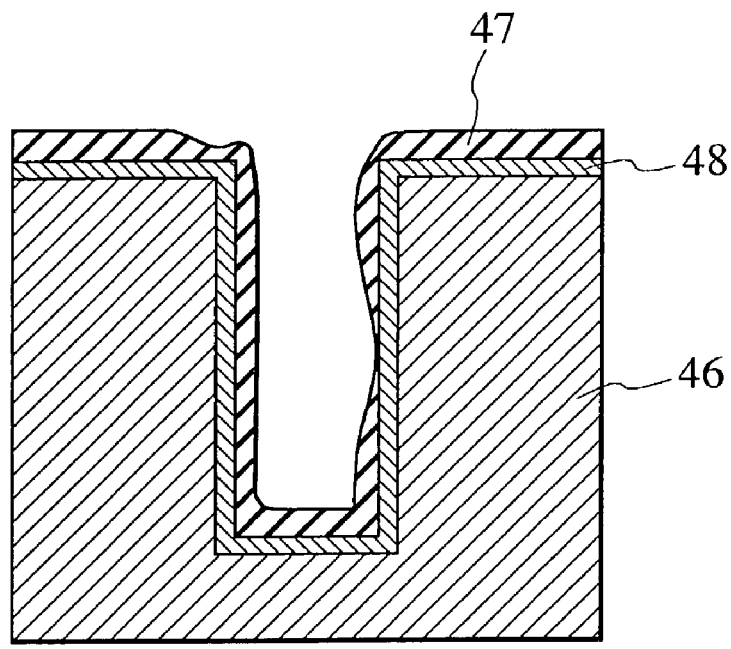
FIG. 20 is an explanatory view illustrating the cause for the occurrence of a void by the plating treatment in the prior art.
Figure 20B:
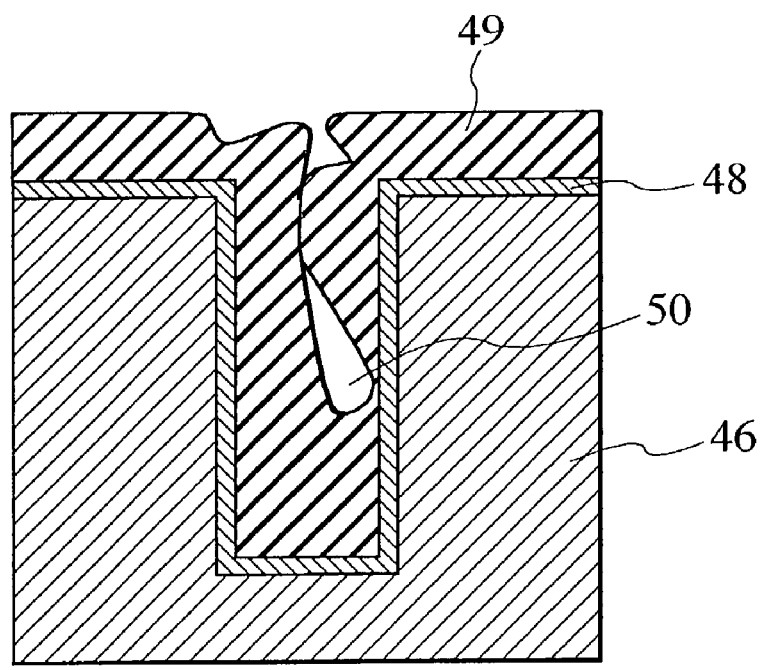

By the use of the auxiliary cathode electrode 60, variations in the plated film thickness of the cathode electrode as the plated body can be reduced. For this purpose, the auxiliary cathode electrode 60 and the cathode electrode are preferably disposed on the same plane. On the contrary, since the preliminary electrolytic electrode 5 as the cathode electrode for preliminary electrolytic current has to come in contact with the plating solution prior to the plated body, it is preferred that the electrode is not on the identical plan with the plating surface of the plated body. In this example, while the electrodes 2, 3, 5 and 60 were arranged in the circuit constitution as shown in FIG. 18, it may be of such a constitution that the power source 62 for the auxiliary cathode electrode 60 is disposed separately, for example, as shown in FIG. 19.

In this example, a phosphorus-containing copper disk of 25.4 cm (10 inch) in diameter having a through hole of 20.3 cm (8 inch) in diameter at the central portion was used as the auxiliary cathode electrode 60, and an epoxy resin was used for the insulation portion 61 disposed between the cathode electrode and the auxiliary cathode electrode 60. The composition of the plating solution 1 and the plating conditions were identical with those in Example 1. Further, a phosphorus-containing copper plate of 300 cm$^2$ in area was used as the anode electrode 2, while a phosphorus-containing copper plate of 1400 cm$^2$ in area was used as the preliminary electrolytic electrode 5. The area of the auxiliary cathode electrode was 175 cm$^2$.

A copper film for wirings was formed in the wafer 3 with the composition of the plating solution 11 and the plating conditions identical with those in Example 1 by using a semiconductor device manufacturing apparatus of this example. The plated body 3 was prepared by forming an SiO$_2$ insulation film, a concave portion for wirings, a barrier film and a copper film as an underlying conductive film in this order on the surface of the silicon wafer in the same manner as in Example 1. The thickness of the obtained barrier metal and the underlying conductive film were identical with that in Example 1. Using the plated body 3, the copper film for wirings was formed as described below and semiconductor devices were manufactured.

At first, a plated body 3 was transported by the transportation manipulator 26 from the pre-plating stage 28 to the plating stage 29, secured to a plating jig with the auxiliary cathode electrode 60, placed on the wafer support portion at the opening of the plating apparatus with the plated surface 4 pointing downwardly and fixed by a wear retaining jig 9, and then a plating solution 11 was introduced at a flow rate of 10 dm$^3$/min into the plating vessel 1b.

Also in this example, like Example 1, since the plating solution 11 was accumulated from the lower portion of the plating vessel 1b, at first the anode electrode 2 and then the preliminary electrolytic electrode 5 came in contact with the plating solution 11. Then, the switch 14 between the preliminary electrolytic electrode 5 and the circuit was turned on at the instant the plating liquid surface reached the level gage 6, and a preliminary electrolytic current at 30 mA (about 0.002 A/dm$^2$ to the auxiliary cathode electrode) was supplied from the anode electrode 2 to the preliminary electrolytic electrode 5 in the same manner as in Example 1.

Successively, in the same manner as in Example 1, after lapse of about 20 sec from the instant the inside of the plating vessel 1 was filled with the plating solution 11, the switch 14 between the preliminary electrolytic electrode 5 and the DC power source 13 was disconnected and, at the same time, a voltage was applied between the anode electrode 2, and the cathode electrode 3 and the auxiliary cathode electrode 60 to supply a current at about 4.75 A (1 A/dm$^2$) to form a copper plated film to fill the concave portion for wirings with copper. Since the uniformness of the underlying film was kept, the obtained copper plated film could fill the concave portion for wirings uniformly without leaving voids.

Then, the plating solution remaining on the surface of the plated body 3 was removed and cleaned at the cleaning stage 30, the wafer was dried at the drying stage 31 and the wafer 3 unloaded from the unload stage 32 was taken out. As a result of electron microscopic observation for the cross section of the obtained wafer 3, defects such as voids were not observed like in Example 1, as shown in FIG. 5B. Further, as a result of using the auxiliary cathode electrode, variations in the film thickness within the surface of the wafer as the plated body could also be decreased. The result for the evaluation of the wafer obtained in this example is as shown in Table 1.

COMPARATIVE EXAMPLE 1

In Comparative Example 1, a copper film for wiring layer was formed in the same manner as in Example 1 using the same cup-type plating treatment vessel as that shown in FIG. 3 except the preliminary electrolytic electrode 5.

At first, a plated body 3 is transported by a transportation manipulator 26 from the pre-plating stage 28 to the plating stage 29, placed at the wafer support portion for the opening of the plating apparatus with the plated surface pointing downwardly and then fixed by a wafer retaining jig to the support portion. Then, the plating solution was charged into the plating vessel at a flow rate of 10 dm$^3$/min.

Also in this comparative example, like Example 1, the plating solution jetted outs from the lower portion of the plating vessel. Therefore, since the surface of the plating liquid was higher at the central portion of the plating bath than near the wall surface of the plating vessel, the plating solution came at first in contact with the central portion of the cathode electrode as the plated body and then the entire surface of the cathode electrode came in contact with the plating solution. As a result, the copper oxide on the surface of the underlying film was partially dissolved and a portion at which the barrier layer was exposed was observed, for example, on the wall surface of the concave portion for wirings.

Subsequently, a voltage was applied between the anode electrode and the cathode electrode to supply a current at about 3 A (1 A/dm$^2$) to form a copper film on the wafer surface. In the copper film thus formed, since the thickness of the underlying film 47 was not uniform, a large number of voids were present in the concave portion for wirings. In particular, since the central portion of the wafer was in contact with the plating solution for a long time, the underlying film 47 was completely dissolved and, as a result, a number of portions leaving voids in the plated film were observed. Table 1 shows the result of evaluation for the wafer obtained according to this comparative example.

COMPARATIVE EXAMPLE 2

In Comparative Example 2, a copper film for wiring layer was formed in the same manner as in Example 1 by using the same vertical plating treatment vessel as that shown in FIG. 4 except the preliminary electrolytic electrode 5.

At first, the plated body was transported by the transportation manipulator 26 from the pre-plating stage 28 to the plating stage 29, fixed to the plating jig and then placed together with the plating jig to the plating vessel and fixed at a predetermined position. Then, when a voltage was applied between the anode electrode and the cathode electrode to supply a current at about 3 A (1 A/dm$^2$) and form a copper film on the safer surface, since the oxide film on the surface of the underlying conductive film was partially dissolved making the underlying film nonuniform also in this comparative example like that in Comparative Example 1, a large number of voids were present in the plated film for wirings filled in the wiring-forming concave portion. Table 1 shows the result of evaluation for the wafer obtained by this comparative example.

According to this invention, dissolution of the underlying conductive film in the electric copper plating treatment can be suppressed and the uniform plated film can be formed and copper wirings with no voids can be formed.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An electric plating apparatus comprising:
   a plating vessel;
   an anode electrode;
   a cathode electrode; and
   a preliminary electrolytic electrode disposed in the plating vessel;
   wherein the preliminary electrolytic electrode is electrically connected in series with the anode electrode before the cathode electrode comes in contact with a plating solution that is introduced to the plating vessel, and
   wherein the preliminary electrolytic electrode is electrically connected in parallel with the cathode electrode after the plating solution comes in contact with said cathode electrode to form said cathode electrode as a plated body.

2. An electric plating apparatus as defined in claim 1, comprising a switch for electrically connecting or disconnecting the preliminary electrolytic electrode with the anode electrode.

3. An electric plating apparatus comprising:
   a plating vessel;
   an anode electrode;
   a cathode electrode; and
   a preliminary electrolytic electrode disposed in the plating vessel, and
   a power source;
   wherein the preliminary electrolytic electrode is electrically connected in series with the anode electrode before the cathode electrode comes in contact with a plating solution that is introduced to the plating vessel, and
   wherein the preliminary electrolytic electrode is electrically connected with the power source in such a manner as to be in parallel as a current path with the cathode electrode after the plating solution comes in contact with said cathode electrode to form said cathode electrode as a plated body.

4. An electric plating apparatus as defined in claim 1 or 3, wherein an area of a surface of the preliminary electrolytic electrode in contact with the plating solution is one-half or more of an area of a surface of the cathode electrode in contact with the plating solution.

5. An electric plating apparatus comprising:
   a plating vessel;
   an anode electrode;
   a cathode electrode, and
   a preliminary electrolytic electrode disposed in the plating vessel;
   wherein the preliminary electrolytic electrode is electrically connected in series with the anode electrode,
   wherein the preliminary electrolytic electrode is electrically connected with the cathode electrode as a plated body, and
   wherein the preliminary electrolytic electrode is disposed at a position where a plating solution comes in contact with the preliminary electrolytic electrode before the plating solution comes in contact with the cathode electrode when the plating solution is introduced to the plating vessel,
   wherein the electric plating apparatus comprises an auxiliary cathode wired in such a manner to be in parallel as a current path with the cathode electrode;

wherein plating for the cathode electrode is carried out in the plating solution by applying a voltage between the cathode electrode and the auxiliary cathode electrode, and the anode electrode.

6. An apparatus for manufacturing semiconductor devices having means for forming a conductive film for wirings by using the electric plating apparatus as defined in claim 5.

7. The electric plating apparatus of claim 3, further comprising a switch disposed between the preliminary electrolytic electrode and the power source.

* * * * *